United States Patent
Matsumoto et al.

(10) Patent No.: US 6,249,026 B1
(45) Date of Patent: Jun. 19, 2001

(54) MOS TRANSISTOR WITH A BURIED OXIDE FILM CONTAINING FLUORINE

(75) Inventors: Takuji Matsumoto; Takashi Ipposhi; Yasuo Yamaguchi, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/436,968

(22) Filed: Nov. 9, 1999

(30) Foreign Application Priority Data

Jun. 1, 1999 (JP) .................................. 11-153904

(51) Int. Cl.[7] ........................ H01L 27/01; H01L 27/12; H01L 31/0392
(52) U.S. Cl. ............................. 257/349; 257/607
(58) Field of Search ................ 257/58, 62, 349, 257/607

(56) References Cited

U.S. PATENT DOCUMENTS 6,049,092 * 4/2000 Konuma et al. ................. 257/66

FOREIGN PATENT DOCUMENTS

| 3-149821 | 6/1991 | (JP) . |
| 5-047726 | 2/1993 | (JP) . |
| 5-217822 | 8/1993 | (JP) . |
| 9-246265 | 9/1997 | (JP) . |

OTHER PUBLICATIONS

Risho Koh, Buried Insulator Engineering for Sub–0.05µm Fully–Depleted Soi–Mosfet to Reduce the Drain Induced Barrier Lowering, Extended Abstracts of the 1998 International Conference on Solid State Devices and Materials, 1998, pp. 96–97.

* cited by examiner

Primary Examiner—Ngân V. Ngô
(74) Attorney, Agent, or Firm—Oblon, Spivak, McClelland, Maier & Neustadt, P.C.

(57) ABSTRACT

An SOI substrate (10) has a buried oxide film (31) formed on a silicon substrate (2) and an SOI layer (4) formed on the buried oxide film. The buried oxide film substantially uniformly contains fluorine over the whole area thereof, and is reduced in relative dielectric constant as compared with a silicon oxide film, having a relative dielectric constant of about 3.9, containing no fluorine. The fluorine concentration of the buried oxide film (31) is set to be at any level in the range of $1 \times 10^{19}$ to $1 \times 10^{22}$ cm$^{-3}$ substantially over the whole area. Thus provided is a MOS transistor suppressing influence by a DIBL effect and preventing occurrence of current leakage on an edge portion of a channel region resulting from influence by an electric field from an adjacent semiconductor element.

17 Claims, 30 Drawing Sheets

F I G. 36
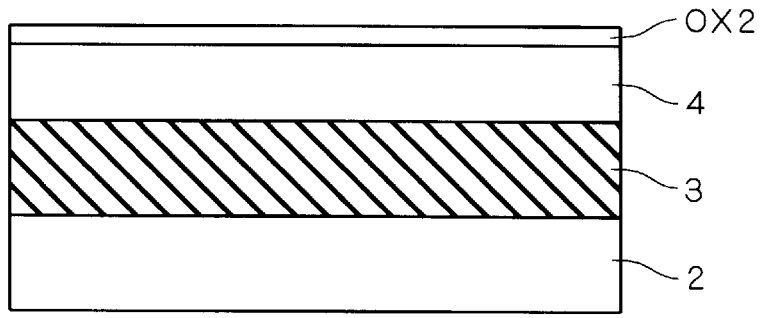
F I G. 37
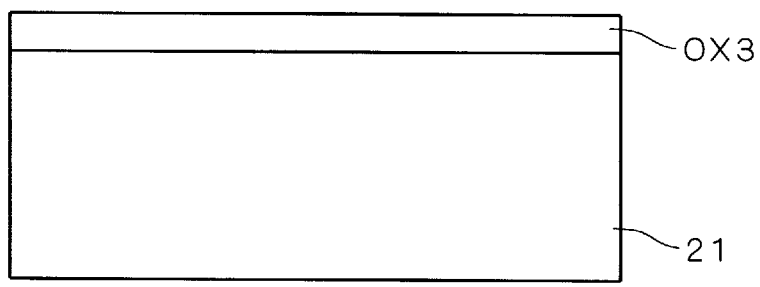
F I G. 38
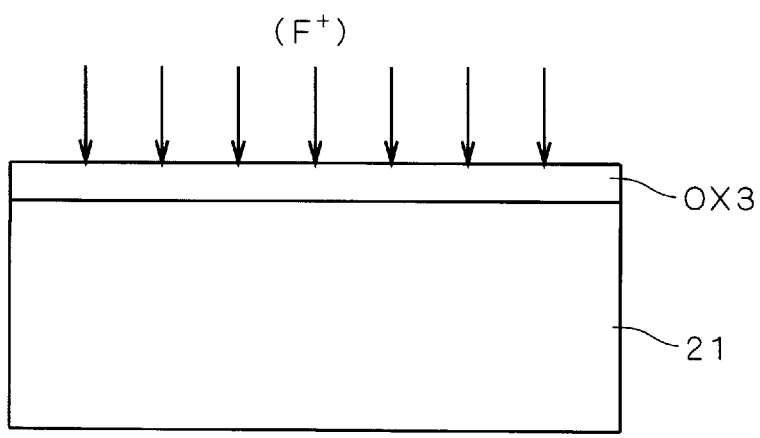

MOS TRANSISTOR WITH A BURIED OXIDE FILM CONTAINING FLUORINE

BACKGROUND OF THE INVENTION

1. Field of the Invention

The present invention relates to a semiconductor device and a method of manufacturing the same, and more particularly, it relates to a semiconductor device formed on an SOI substrate and a method of manufacturing the same.

2. Description of the Background Art

In a conventional MOS field-effect transistor (MOSFET: hereinafter referred to as a MOS transistor) formed on an SOI substrate having a buried oxide film formed on a silicon substrate and an SOI (silicon on insulator) layer formed on the buried oxide film, a phenomenon called a DIBL (drain induced barrier lowering) effect is now coming into question due to refinement of elements.

FIG. 65 typically shows a sectional structure of a conventional MOS transistor Q1 formed on a conventional SOI substrate 1.

The SOI substrate 1 has a buried oxide film 3 formed on a silicon substrate 2 and an SOI layer 4 formed on the buried oxide film 3. A channel region 7 is arranged in the SOI layer 4 with a drain region 5 and a source region 6 arranged on both sides thereof, while a gate electrode 9 is arranged above the channel region 7 through a gate insulator film 8 to form the MOS transistor Q1. The MOS transistor Q1 is an n-channel transistor.

When applying voltages to the gate electrode 9 and the drain region 5 in such a MOS transistor Q1, a potential barrier in the vicinity of the source region 6 lowers and electrons flow from the source region 6 to the drain region 5 through a channel formed in the channel region 7. While this is a normal operation, the DIBL effect is a phenomenon lowering the potential barrier of a p-n junction of the source region 6 and lowering the threshold voltage of the transistor Q1 due to application of a high voltage to the drain region 5. Particularly in the MOS transistor Q1 formed on the SOI substrate 1 shown in FIG. 65, the DIBL effect remarkably appears due to an operation in a state electrically floating the channel region 7 and an electric field (referred to as a drain electric field) sneaking up on the source region 6 from the drain region 5 through the buried oxide film 3 as shown by arrows in FIG. 65, to result in a problem. It is particularly important for a MOS transistor formed on an SOI substrate to solve the problem of the DIBL effect.

FIGS. 66A and 66B typically show the DIBL effect. FIG. 66A is a model diagram of the MOS transistor Q1, and FIG. 66B is a conceptual diagram of a potential barrier PB.

As shown in FIG. 66B, the potential barrier PB is held and no electrons flow out from the source region 6 when a drain voltage $V_D$ is zero as shown on a characteristic curve A. When the drain voltage $V_D$ is supplied, however, the value of the potential barrier PB reduces in response to the drain voltage $V_D$.

Referring to FIG. 66B, the drain voltage $V_D$ is relatively small on a characteristic curve B and relatively large on a characteristic curve C. Thus, it follows that the potential barrier PB reduces due to a drain electric field to lower the threshold even if no voltage is supplied to the gate electrode 9. When the potential barrier PB reduces beyond a certain extent, electrons flow out from the source region 6 toward the drain region 5 even if no voltage is supplied to the gate electrode 9, to disadvantageously disable the gate electrode 9 from a switching operation.

Particularly in a short-channel MOS transistor having a short channel length developed in view of refinement of the element, the drain electric field relatively strengthens and hence influence by the DIBL effect is further serious.

Following improvement of the degree of integration, further, it is apprehended that an operation of an adjacent element exerts influence on a MOS transistor as shown below.

FIG. 67 is a plan view showing two MOS transistors Q1 and Q2 as viewed from above gate electrodes 9 and 91. The gate electrodes 9 and 91 of the MOS transistors Q1 and Q2 are arranged perpendicularly to each other, and a drain region 51 (a source region 61 is provided through the gate electrode 91) of the MOS transistor Q2 is arranged in parallel with a drain region 5, a source region 6 and a channel region 7 of the MOS transistor Q1 through an element isolation film IR.

FIG. 68 is a sectional view taken along the line X—X in FIG. 67. As shown in FIG. 68, the drain region 51 of the MOS transistor Q2 is opposed to the channel region 7 of the MOS transistor Q1 through the element isolation film IR formed by a silicon oxide film. When a drain voltage $V_{D1}$ is applied to the drain region 51, therefore, a drain electric field sneaks up on the source region 6 through a buried oxide film 3 to induce electrons on an edge portion of the channel region 7, and the electrons cause current leakage of the MOS transistor Q1. Further, part of the drain electric field passing through the element isolation film IR also induces electrons on the edge portion of the channel region 7.

Particularly under such present circumstances that the distance between the MOS transistors Q1 and Q2, i.e., a distance L shown in FIG. 67 is getting shorter following improvement of the degree of integration, the problem of current leakage (referred to as edge leakage) from the edge portion of the channel region 7 is an unignorable phenomenon. Also when a diode is formed in place of the MOS transistor Q2, a similar phenomenon occurs due to a voltage applied to a semiconductor region of the diode.

This phenomenon similarly occurs also in a MOS transistor formed on a bulk silicon substrate.

SUMMARY OF THE INVENTION

According to a first aspect of the present invention, a semiconductor device comprises an SOI substrate having a silicon substrate, a buried oxide film containing fluorine formed on the silicon substrate and an SOI layer formed on the buried oxide film, and a semiconductor element formed on the SOI layer, and the buried oxide film substantially uniformly contains fluorine in prescribed concentration over the whole area.

In the first aspect, the relative dielectric constant of the buried oxide film is lowered by fluorine contained therein, and the parasitic capacitance between the semiconductor element and the silicon substrate can be reduced.

According to a second aspect of the present invention, the semiconductor element is a MOSFET.

In the second aspect, influence by a DIBL effect can be suppressed when the semiconductor element is a MOSFET. Also when a drain voltage is applied to a drain region of a MOS transistor formed in the SOI layer, a drain electric field sneaking up on the source region from the drain region through the buried oxide film is so weakened that it is possible to inhibit a threshold from lowering due to reduction of a potential barrier in the vicinity of the source region resulting from the electric field for preventing electrons from flowing out from the source region when no gate voltage is applied and preventing a defective switching operation. Due to such reinforcement against the DIBL effect, the impurity concentration of a channel region of the MOS transistor can be reduced and the ability of current drive can be improved for improving the operating speed of the MOS transistor. Further, various parasitic capacitances can be reduced due to reduction of the relative dielectric constant of the buried oxide film, to attain an effect of reducing power consumption. Due to reduction of the relative dielectric constant of the buried oxide film, further, a drain electric field sneaking up on the channel region of the MOS transistor from an adjacent element through the buried oxide film is weakened, to inhibit induction of electrons on an edge portion of the channel region and suppress occurrence of current leakage on the edge portion of the channel region of the MOS transistor.

According to a third aspect of the present invention, the semiconductor element is a MOSFET, the MOSFET has a channel region forming a channel and a drain region and a source region formed on both sides of the channel region in the SOI layer, and the buried oxide film includes first and second fluorine-containing regions formed in regions corresponding to lower portions of the drain region and the source region and substantially uniformly containing fluorine in prescribed concentration over the whole areas and a normal region formed in a region corresponding to a lower portion of the channel region and containing no fluorine.

In the third aspect, the MOSFET has the normal region formed in the region corresponding to the lower portion of the channel region and containing no fluorine, whereby the potential of the channel region can be controlled with the potential of the silicon substrate and hence potential fluctuation of the channel region can be suppressed. Further, influence by the DIBL effect can be suppressed due to the presence of the first and second fluorine-containing regions.

According to a fourth aspect of the present invention, the maximum value of the prescribed concentration of fluorine is any level in the range of $1 \times 10^{19}$ to $1 \times 10^{22}$ cm$^{-3}$.

In the fourth aspect, a structure capable of reliably suppressing influence by the DIBL effect can be obtained.

According to a fifth aspect of the present invention, the semiconductor device further comprises an element isolation film formed in the SOI layer around the MOSFET to reach the main surface of the buried oxide film from the main surface of the SOI layer, and the element isolation film contains fluorine.

In the fifth aspect, the relative dielectric constant of the element isolation film is reduced and hence an electric field sneaking up on the channel region of the MOS transistor from an adjacent element through the element isolation film is weakened, while the relative dielectric constant of the buried oxide film is also reduced and hence the drain electric field sneaking up on the channel region through the buried oxide is so weak that induction of electrons on the edge portion of the channel region is further suppressed.

According to a sixth aspect of the present invention, a semiconductor device comprises a silicon substrate, a MOSFET formed on the silicon substrate, and an element isolation film formed in the main surface of the silicon substrate around the MOSFET, and the element isolation film contains fluorine.

In the sixth aspect, the relative dielectric constant of the element isolation film is so reduced that an electric field sneaking up on a channel region of the MOS transistor formed on the bulk silicon substrate from an adjacent element through the element isolation film is weakened for inhibiting induction of electrons on an edge portion of the channel region and suppressing occurrence of current leakage on the edge portion of the channel region of the MOS transistor.

According to a seventh aspect of the present invention, a semiconductor device comprises an SOI substrate having a silicon substrate, a buried oxide film formed on the silicon substrate and an SOI layer formed on the buried oxide film, a MOSFET formed on the SOI layer, and an element isolation film formed in the SOI layer around the MOSFET to reach the main surface of the buried oxide film from the main surface of the SOI layer, and the element isolation film contains fluorine.

In the seventh aspect, current leakage can be effectively reduced on an edge portion of the channel region of the MOS transistor when an electric field from an adjacent element sneaking up on the channel region through the element isolation film mainly induces electrons on the edge portion of the channel region of the MOS transistor.

The present invention is also directed to a method of manufacturing a semiconductor device. According to an eighth aspect of the present invention, a method of manufacturing a semiconductor device comprising an SOI substrate having a silicon substrate, a buried oxide film containing fluorine formed on the silicon substrate and an SOI layer formed on the buried oxide film and a MOSFET formed on the SOI layer comprises the steps of (a) implanting oxygen ions into the silicon substrate to reach a dose of $1 \times 10^{17}$ to $2 \times 10^{18}$ cm$^{-2}$, (b) implanting fluorine ions into the silicon substrate in the same range as the range of the oxygen ions to reach a dose of $1 \times 10^{14}$ to $1 \times 10^{19}$ cm$^{-2}$, and (c) performing heat treatment under a temperature condition of 1000 to 1350° C. for diffusing ion-implanted oxygen and fluorine and forming the buried oxide film substantially uniformly containing fluorine in prescribed concentration over the whole area.

According to a ninth aspect of the present invention, a method of manufacturing a semiconductor device comprising an SOI substrate having a silicon substrate, a buried oxide film containing fluorine formed on the silicon substrate and an SOI layer formed on the buried oxide film and a MOSFET formed on the SOI layer comprises the steps of (a) implanting oxygen ions into the silicon substrate to reach a dose of about $4 \times 10^{17}$ cm$^{-2}$, (b) implanting fluorine ions into the silicon substrate in the same range as the range of the oxygen ions to reach a dose of $1 \times 10^{14}$ to $1 \times 10^{19}$ cm$^{-2}$, and (c) performing oxidation under a temperature condition of 1000 to 1350° C. for diffusing ion-implanted oxygen and fluorine and forming the buried oxide film substantially uniformly containing fluorine in prescribed concentration over the whole area while forming an oxide film on the surface of the silicon substrate.

According to a tenth aspect of the present invention, the step (b) includes the steps of assuming a position closer to an upper portion of the buried oxide film and implanting fluorine ions into the position, and assuming a position closer to a lower portion of the buried oxide film and implanting fluorine ions into the position.

According to an eleventh aspect of the present invention, a method of manufacturing a semiconductor device comprising an SOI substrate having a silicon substrate, a buried oxide film containing fluorine formed on the silicon substrate and an SOI layer formed on the buried oxide film and a MOSFET formed on the SOI layer comprises the steps of (a) preparing a silicon substrate for bonding different from the silicon substrate and forming a buried oxide film substantially uniformly containing fluorine in prescribed concentration over the whole area on the main surface of the silicon substrate for bonding, (b) implanting hydrogen ions into a position deeper than the interface between the buried oxide film and the silicon substrate for bonding to reach a dose of $1\times10^{16}$ to $1\times10^{17}$ cm$^{-2}$ for forming a defect layer, (c) bonding the silicon substrate for bonding and the silicon substrate so that the main surface of the silicon substrate for bonding formed with the buried oxide film faces the main surface of the silicon substrate, and (d) performing heat treatment under a temperature condition of 400 to 700° C. for exfoliating a portion of the silicon substrate for bonding opposite to the buried oxide film along the defect layer thereby forming the SOI substrate.

According to a twelfth aspect of the present invention, the step (a) includes the steps of (a-1) forming an oxide film on the main surface of the silicon substrate for bonding, (a-2) implanting fluorine ions into the oxide film to reach a dose of $1\times10^{14}$ to $1\times10^{19}$ cm$^{-2}$, and (a-3) performing heat treatment under a temperature condition of 1000 to 1350° C. for uniformly diffusing ion-implanted fluorine over the whole area.

According to a thirteenth aspect of the present invention, the step (a-2) includes the step of implanting fluorine ions into a central portion of the oxide film.

According to a fourteenth aspect of the present invention, the step (a-2) includes the steps of implanting fluorine ions into a position closer to an upper portion of the oxide film, and implanting fluorine ions into a position closer to a lower portion of the oxide film.

According to a fifteenth aspect of the present invention, the step (a) includes the step of forming the buried oxide film by CVD using reactive gas containing fluorine.

According to a sixteenth aspect of the present invention, a method of manufacturing a semiconductor device comprising an SOI substrate having a silicon substrate, a buried oxide layer containing fluorine formed on the silicon substrate and an SOI layer formed on the buried oxide film and a MOSFET formed on the SOI layer comprises the steps of (a) preparing a silicon substrate for bonding different from the silicon substrate and forming a porous silicon layer on the main surface of the silicon substrate for bonding by anodization process, (b) epitaxially growing a single-crystalline silicon layer as the porous silicon layer thereby forming an epitaxial layer, (c) forming a buried oxide film substantially uniformly containing fluorine in prescribed concentration over the whole area on the epitaxial layer, (d) bonding the silicon substrate for bonding and the silicon substrate so that the main surface of the silicon substrate for bonding formed with the buried oxide film faces the main surface of the silicon substrate, and (e) removing a portion of the silicon substrate for bonding opposite to the buried oxide film along the porous silicon layer and thereafter removing the porous silicon layer for forming the SOI substrate.

According to a seventeenth aspect of the present invention, the step (c) includes the steps of (c-1) forming an oxide film on the main surface of the silicon substrate for bonding, (c-2) implanting fluorine ions into the oxide film to reach a dose of $1\times10^{14}$ to $1\times10^{19}$ cm$^{-2}$, and (c-3) performing heat treatment under a temperature condition of 1000 to 1350° C. for uniformly diffusing ion-implanted fluorine over the whole area.

According to an eighteenth aspect of the present invention, the step (c-2) includes the step of implanting fluorine ions into a central portion of the oxide film.

According to a nineteenth aspect of the present invention, the step (c-2) includes the steps of implanting fluorine ions into a position closer to an upper portion of the oxide film, and implanting fluorine ions into a position closer to a lower portion of the oxide film.

According to a twentieth aspect of the present invention, the step (a) includes the step of forming the buried oxide film by CVD using reactive gas containing fluorine.

According to a twenty-first aspect of the present invention, a method of manufacturing a semiconductor device comprising an SOI substrate having a silicon substrate, a buried oxide film containing fluorine formed on the silicon substrate and an SOI layer formed on the buried oxide film and a MOSFET formed on the SOI layer comprises the steps of (a) preparing an ordinary SOI substrate having a buried oxide film containing no fluorine formed on the silicon substrate and the SOI layer formed on the buried oxide film containing no fluorine, (b) implanting fluorine ions into the buried oxide film containing no fluorine to reach a dose of $1\times10^{14}$ to $1\times10^{19}$ cm$^{-2}$, and (c-3) performing heat treatment under a temperature condition of 1000 to 1350° C. for uniformly diffusing ion-implanted fluorine over the whole area and converting the buried oxide film containing no fluorine to the buried oxide film containing fluorine.

According to a twenty-second aspect of the present invention, the step (b) includes the step of implanting fluorine ions into a central portion of the buried oxide film containing no fluorine.

According to a twenty-third aspect of the present invention, the step (b) includes the steps of implanting fluorine ions into a position closer to an upper portion of the buried oxide film containing no fluorine, and implanting fluorine ions into a position closer to a lower portion of the buried oxide film containing no fluorine.

An object of the present invention is to provide a MOS transistor suppressing influence by a DIBL effect as well as to provide a MOS transistor preventing occurrence of current leakage on an edge portion of a channel region resulting from influence by an electric field from an adjacent semiconductor element.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 29 to 36 illustrate steps of manufacturing an SOI substrate by low-dose SIMOX;

FIGS. 37 to 48 illustrate steps of manufacturing an SOI substrate by a smart cut technique;

DESCRIPTION OF THE PREFERRED EMBODIMENTS

<A. First Embodiment>

<A-1. Device Structure>

Figure 1:
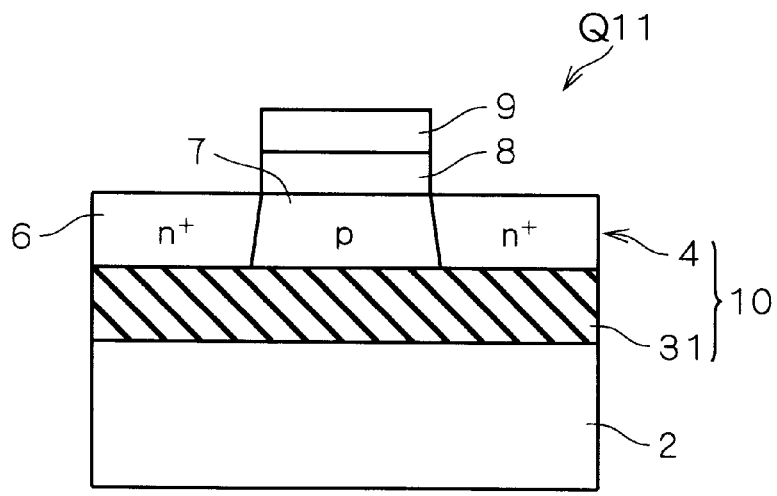
FIG. 1 illustrates a sectional structure of a MOS transistor according to a first embodiment of the present invention.

FIG. 1 typically shows a sectional structure of a MOS field-effect transistor (MOSFET: hereinafter referred to as a MOS transistor) Q11 formed on an SOI substrate 10 according to a first embodiment of the present invention.

The SOI substrate 10 has a buried oxide film 31 formed on a silicon substrate 2 and an SOI layer 4 formed on the buried oxide film 31. The SOI layer 4 is provided therein with a channel region 7 as well as a drain region 5 and a source region 6 arranged on both sides of the channel region 7, while a gate electrode 9 is arranged on the channel region 7 through a gate insulating film 8 to form the MOS transistor Q11. The MOS transistor Q11 is an n-channel transistor.

The buried oxide film 31 substantially uniformly contains fluorine (F) over the whole area thereof, and is reduced in relative dielectric constant as compared with a silicon oxide film, having a relative dielectric constant of about 3.9, containing no fluorine. The relative dielectric constant is slightly smaller than 3.9 when the fluorine concentration of the buried oxide film 31 is $1 \times 10^{19}$ cm$^{-3}$, while the relative dielectric constant is about 3.0 when the fluorine concentration of the buried oxide film 31 is $1 \times 10^{22}$ cm$^{-3}$.

Thus, the fluorine concentration of the buried oxide film 31 is set to be at any level in the range of $1 \times 10^{19}$ to $1 \times 10^{22}$ cm$^{-3}$ substantially over the whole area, and distribution of the fluorine concentration is set in the range given by the following numerical formula (1):

$$\log_{10} \frac{N_{F\max}}{N_{F\min}} \leq 2 \quad (1)$$

Referring to the numerical formula (1), $N_{F\max}$ represents the maximum concentration (cm$^{-3}$) of fluorine in the film, and $N_{F\min}$ represents the minimum concentration (cm$^{-3}$) of fluorine in the film.

Figure 2:
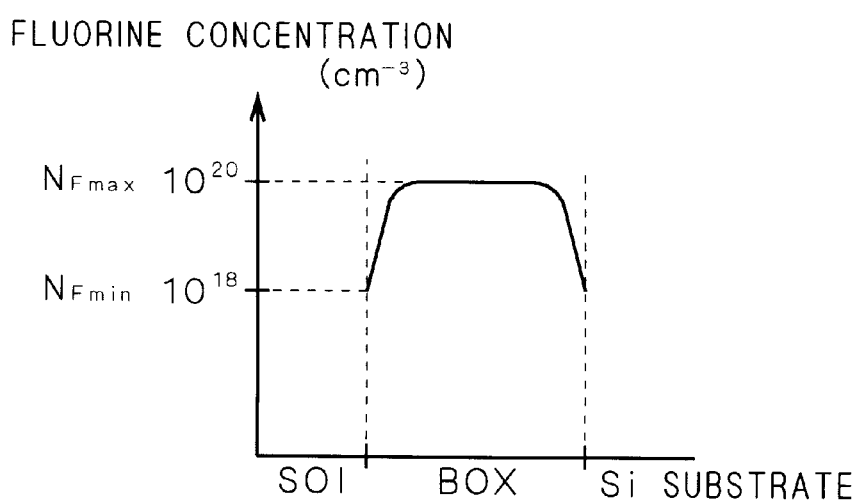
FIG. 2 illustrates exemplary fluorine concentration distribution in a buried oxide film of the MOS transistor according to the first embodiment of the present invention.

The above numerical formula (1) means that the fluorine concentration distribution in the buried oxide film 31 is within two digits. FIG. 2 shows exemplary fluorine concentration distribution satisfying the numerical formula (1).

Referring to FIG. 2, the horizontal axis shows the positional relation of the structure in the SOI substrate 10 along the depth direction, and the vertical axis shows the fluorine concentration. As shown in FIG. 2, the fluorine concentration, which is at the minimum $N_{F\min}$ ($1 \times 10^{18}$ cm$^{-3}$) in the buried oxide film 31 (denoted as BOX) in the vicinity of the boundary between the same and the SOI layer 4 (denoted as SOI) and in the vicinity of the boundary between the same and the silicon substrate 2 (denoted as Si SUBSTRATE), is at the maximum $N_{F\max}$ ($1 \times 10^{20}$ cm$^{-3}$) in the remaining portions, and it can be said that the fluorine concentration is at least $1 \times 10^{19}$ cm$^{-3}$ substantially over the whole area. Thus, even if a portion having extremely low fluorine concentration is present on the BOX-SOI interface (or the SOI-BOX interface), the function/effect of the present invention can be sufficiently attained when substantially flat concentration distribution is attained in the buried oxide film 31. It has been proved that, even if the fluorine concentration changes in a remarkably narrow region in the vicinity of the BOX-SOI interface, this hardly influences the relative dielectric constant of the buried oxide film 31.

<A-2. Function/Effect>

Thus, the buried oxide film 31 containing fluorine is reduced in relative dielectric constant, to attain the following function/effect:

First, influence by a DIBL effect can be suppressed. The buried oxide film 31 is reduced in relative dielectric constant, and hence a drain electric field sneaking up on the source region 6 from the drain region 5 through the buried oxide film 31 is weakened even if a drain voltage is applied to the drain region 5, whereby a threshold is inhibited from reduction due to reduction of a potential barrier in the vicinity of the source region 6 resulting from the electric field. Thus, it is possible to prevent electrons from flowing out from the source region 6 when no gate voltage is applied, thereby preventing a defective switching operation.

Second, the impurity concentration of the channel region 7 can be reduced due to reinforcement against the DIBL effect, and ability of current drive can be improved for improving the operating speed of the MOS transistor Q11.

Figure 3:
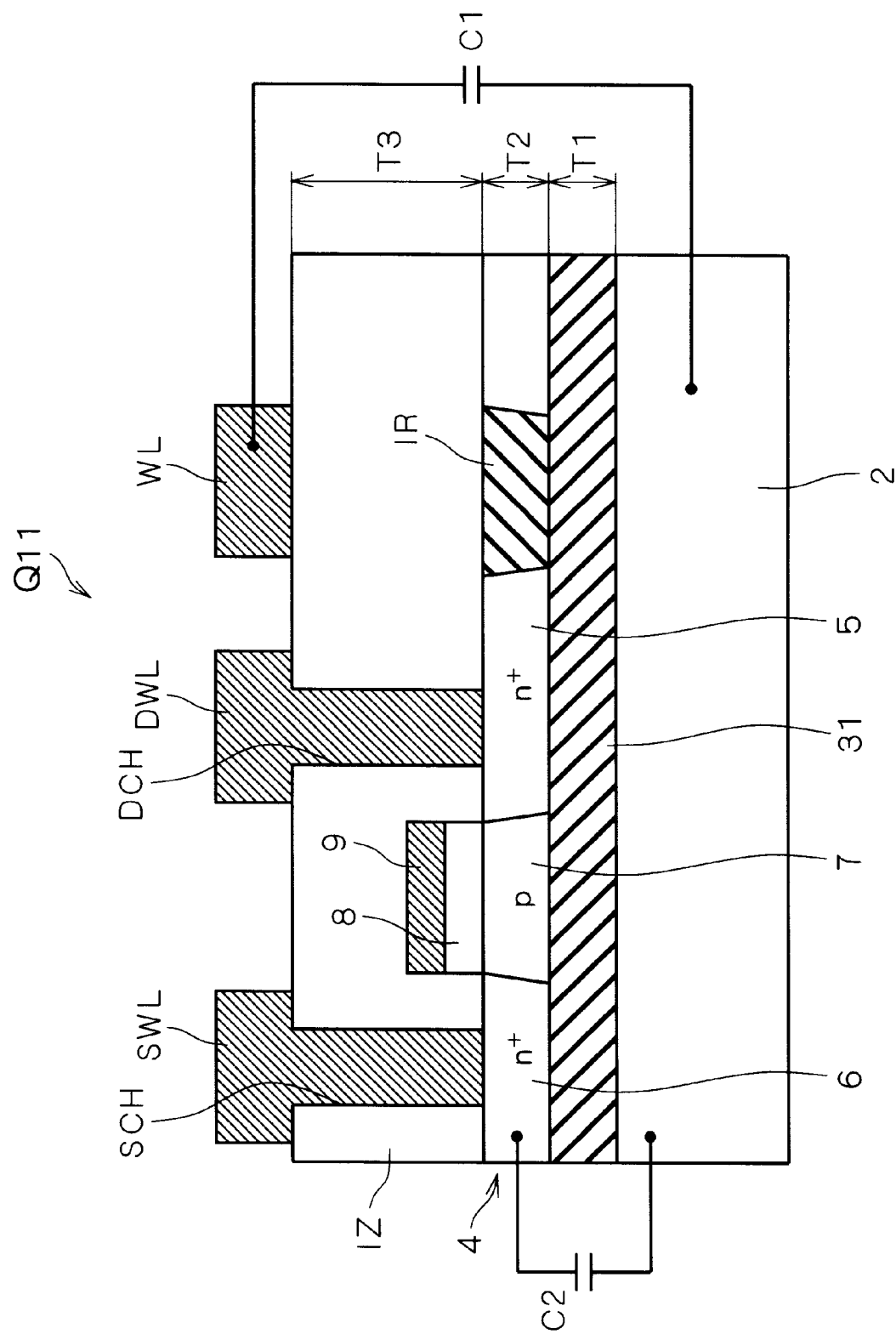
FIG. 3 illustrates a sectional structure of the MOS transistor according to the first embodiment of the present invention inclusive of a peripheral portion.

Third, various parasitic capacitances can be reduced due to reduction of the relative dielectric constant of the buried oxide film 31. FIG. 3 typically shows various parasitic capacitances in the MOS transistor Q11.

FIG. 3 illustrates the MOS transistor Q11 shown in FIG. 1 inclusive of an interlayer isolation film IZ, which is provided with contact holes DCH and SCH reaching the drain region 5 and the source region 6 respectively. A drain wiring layer DWL and a source wiring layer SWL made of a conductive material such as aluminum are buried in the contact holes DCH and SCH respectively. FIG. 3 also illustrates an element isolation film IR formed in the SOI layer 4 around the MOS transistor Q11 for electrically isolating the MOS transistor Q11 from another element. A wiring layer WL made of a conductive material such as aluminum is arranged on a portion of the interlayer isolation film IZ corresponding to the element isolation film IR.

As shown in FIG. 3, a parasitic capacitance C1 resulting from the buried oxide film 31, the element isolation film IR and the interlayer isolation film IZ is present between the wiring layer WL and the silicon substrate 2, and a parasitic capacitance C2 resulting from the buried oxide film 31 is present between the drain and source regions 5 and 6 and the silicon substrate 2.

Assuming that T1, T2 and T3 represent the thickness of the buried oxide film 31, the element isolation film IR and the interlayer isolation film IZ respectively and $\epsilon1$, $\epsilon2$ and $\epsilon3$ represent the relative dielectric constants of the buried oxide film 31, the element isolation film IR and the interlayer isolation film IZ respectively, the value of the parasitic capacitance C1 with respect to the silicon substrate 2 can be obtained through the following numerical formula (2):

$$C1 = \frac{1}{\frac{T_1}{\varepsilon_1} + \frac{T_2}{\varepsilon_2} + \frac{T_3}{\varepsilon_3}} \quad (2)$$

Thus, the parasitic capacitance C1 can be reduced by lowering the relative dielectric constant of the buried oxide film 31. This also applies to the parasitic capacitance C2.

The operating speed of the MOS transistor Q11 can be improved by reducing the parasitic capacitances C1 and C2. Further, power consumption can also be reduced by reducing the parasitic capacitances C1 and C2.

Fourth, an electric field from an adjacent element is inhibited from influencing the MOS transistor Q11 due to reduction of the relative dielectric constant of the buried oxide film 31.

Figure 4:
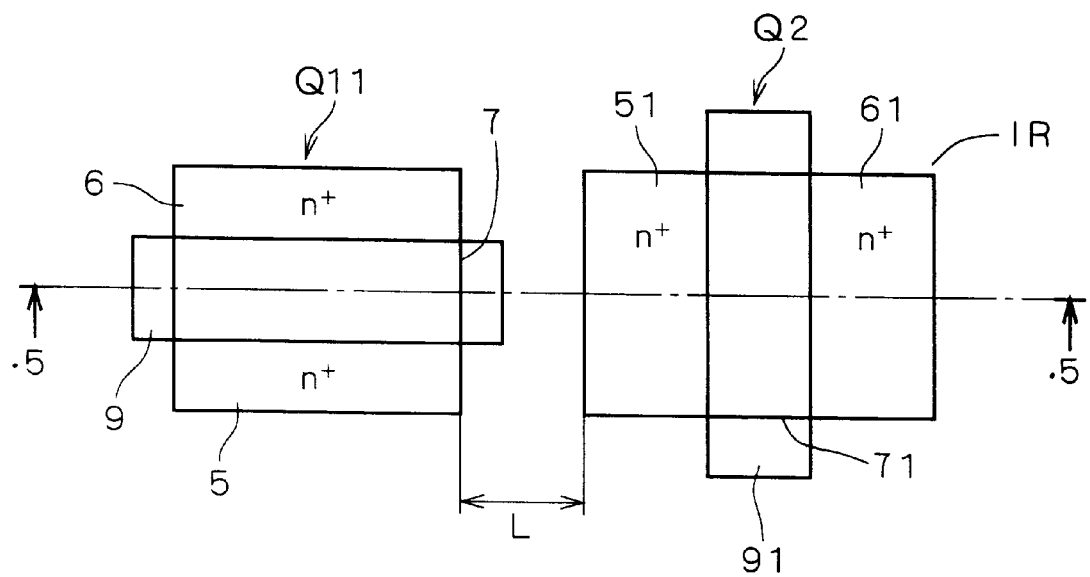
FIG. 4 illustrates a plane structure of the MOS transistor according to the first embodiment of the present invention.

FIG. 4 is a plan view of two MOS transistors Q11 and Q2 as viewed from above the gate electrode 9 and a gate electrode 91. The gate electrode 9 of the MOS transistor Q11 and the gate electrode 91 of the MOS transistor Q2 are arranged perpendicularly to each other, while a drain region 51 (a source region 61 is provided through the gate electrode 91) of the MOS transistor Q2 is arranged in parallel with the drain region 5, the source region 6 and the channel region 7 of the MOS transistor Q11 through the element isolation film IR.

Figure 5:
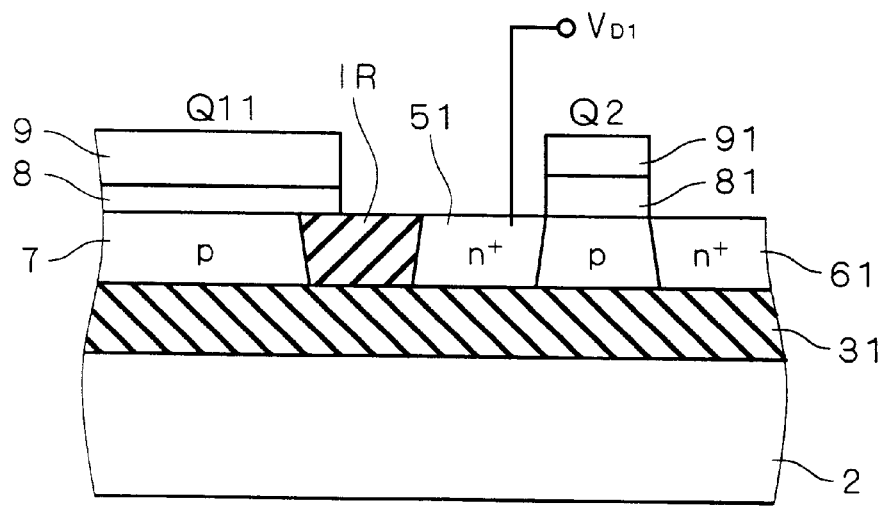
FIG. 5 illustrates the sectional structure of the MOS transistor according to the first embodiment of the present invention.

FIG. 5 is a sectional view taken along the line X—X in FIG. 4. While the drain region 51 of the MOS transistor Q2 is opposed to the channel region 7 of the MOS transistor Q11 through the element isolation film IR formed by a silicon oxide film as shown in FIG. 5, the relative dielectric constant of the buried oxide film 31 is reduced and hence a drain electric field sneaking up on the channel region 7 through the buried oxide film 31 is so weak that induction of electrons on an edge portion of the channel region 7 is suppressed even if a drain voltage VD1 is applied to the drain region 51.

Thus, occurrence of current leakage (hereinafter referred to as edge leakage) is suppressed on the edge portion of the channel region 7 of the MOS transistor Q11.

Reduction of edge leakage caused by electrons induced by a portion of the drain electric field passing through the element isolation film IR is described with reference to the following modification 1.

<A-3. Modification 1>

Figure 6:
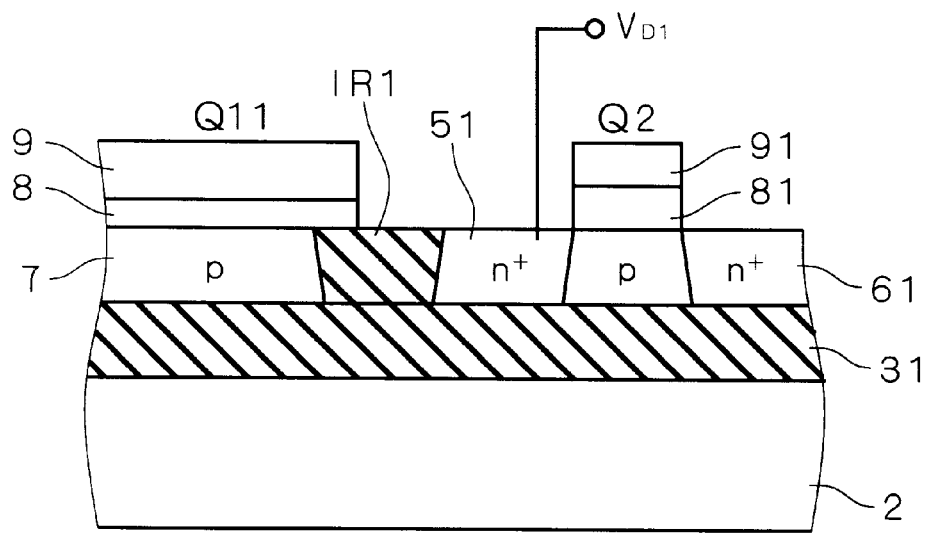
FIG. 6 illustrates a sectional structure of a modification 1 of the MOS transistor according to the first embodiment of the present invention.

While the first embodiment has been described with reference to the structure of inhibiting the drain electric field from sneaking up on the source region 6 and inhibiting the electric field from the adjacent element from sneaking up on the channel region 7 by the buried oxide film 31 containing fluorine, the electric field from the adjacent element reaches the channel region 7 through the element isolation film IR. FIG. 6 shows a structure for reducing this.

FIG. 6 illustrates sectional structures of two adjacent MOS transistors Q11 and Q2 in correspondence to the sectional view taken along the line X—X in FIG. 4. As shown in FIG. 6, a drain region 51 of the MOS transistor Q2 is opposed to a channel region 7 of the MOS transistor Q11 through an element isolation film IR1 formed by a silicon oxide film containing fluorine. The element isolation film IR1 is reduced in relative dielectric constant, and hence a drain electric field passing through the buried oxide film 31 and reaching the channel region 7 is weak even if a drain voltage $V_{D1}$ is applied to the drain region 51, while a buried oxide film 31 is also reduced in relative dielectric constant and hence a drain electric field sneaking up on the channel region 7 through the buried oxide film 31 is weak and induction of electrons on an edge portion of the channel region 7 is further suppressed. The maximum concentration of fluorine in the element isolation film IR1 is set at any level in the range of $1 \times 10^{19}$ to $1 \times 10^{22}$ cm$^{-3}$.

<A-4. Modification 2>

Figure 7:
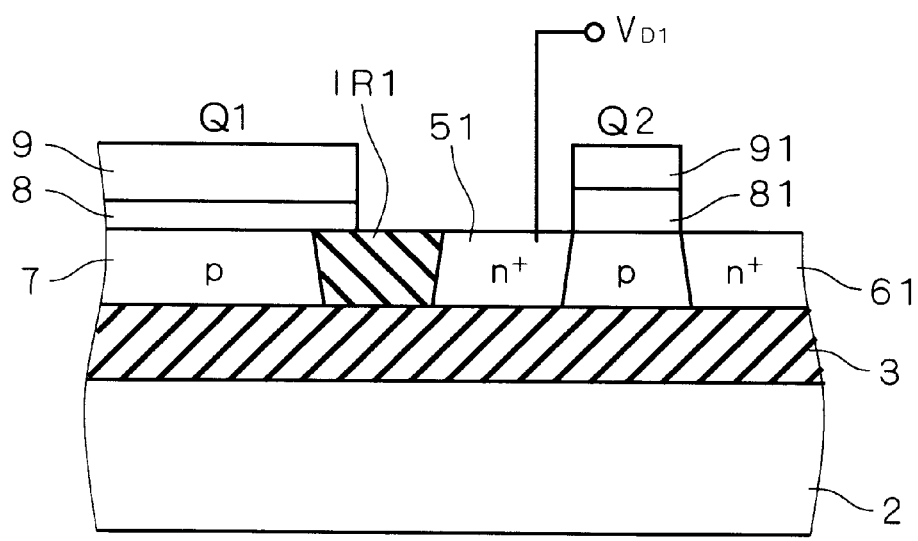
FIG. 7 illustrates a sectional structure of a modification 2 of the MOS transistor according to the first embodiment of the present invention.

The modification 1 has been described with reference to the structure of suppressing influence by the electric field from the adjacent element by the element isolation film IR1 and the buried oxide film 31 containing fluorine with reference to FIG. 6, a structure shown in FIG. 7 is also available when limiting to suppression of influence by an electric field from an adjacent element.

FIG. 7 illustrates sectional structures of two adjacent MOS transistors Q1 and Q2, which are electrically isolated from each other by an element isolation film IR1 containing fluorine, while a buried oxide film 3 contains no fluorine but has the same structure as the prior art. The maximum concentration of fluorine in the element isolation film IR1 is set at any level in the range of $1 \times 10^{19}$ to $1 \times 10^{22}$ cm$^{-3}$.

When a drain voltage $V_{D1}$ is applied to a drain region 51, therefore, a drain electric field sneaking up a channel region 7 through the buried oxide film 3 cannot be suppressed although a drain electric field passing through the element isolation film IR1 and reaching the channel region 7 can be suppressed. If the drain electric field passing through the element isolation film IR1 and reaching the channel region 7 mainly induces electrons on an edge portion of the channel region 7, however, edge leakage can be effectively reduced only with the element isolation film IR1.

<A-5. Modification 3>

While each of the modifications 1 and 2 shown in FIGS. 6 and 7 has been described with reference to such a structure that the element isolation film provided between two adjacent MOS transistors formed on an SOI substrate contains fluorine, an element isolation film for a MOS transistor formed on a bulk silicon substrate may be formed by a silicon oxide film containing fluorine.

Figure 8:
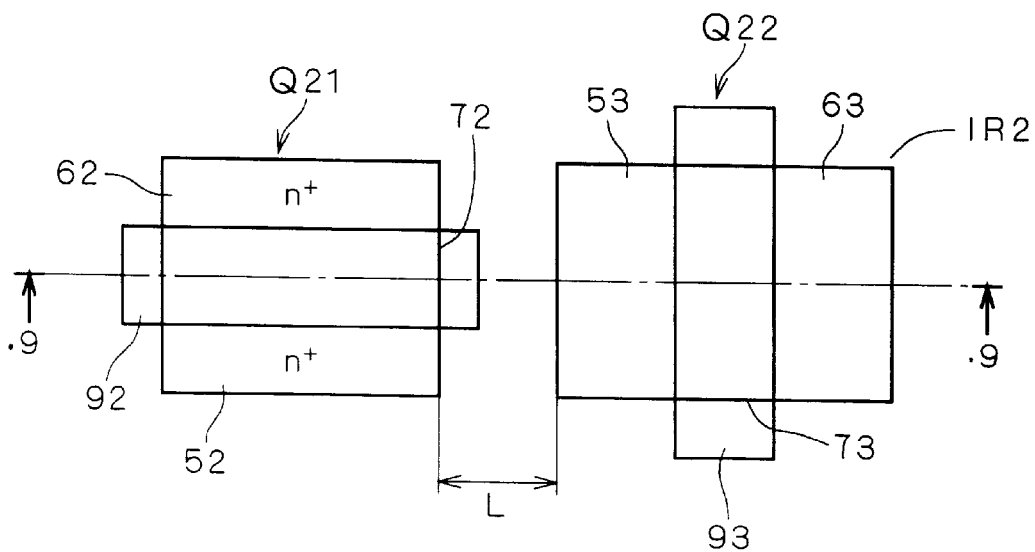
FIG. 8 illustrates a plane structure of a modification 3 of the MOS transistor according to the first embodiment of the present invention.

FIG. 8 is a plan view showing two adjacent MOS transistors Q21 and Q22 formed on a bulk silicon substrate as viewed from above gate electrodes 92 and 93.

As shown in FIG. 8, the gate electrode 92 of the MOS transistor Q21 and the gate electrode 93 of the MOS transistor Q22 are arranged perpendicularly to each other, while a drain region 53 (a source region 63 is provided through the gate electrode 93) of the MOS transistor Q22 is arranged in parallel with a drain region 52, a source region 62 and a channel region 72 of the MOS transistor Q21 through an element isolation film IR2.

Figure 9:
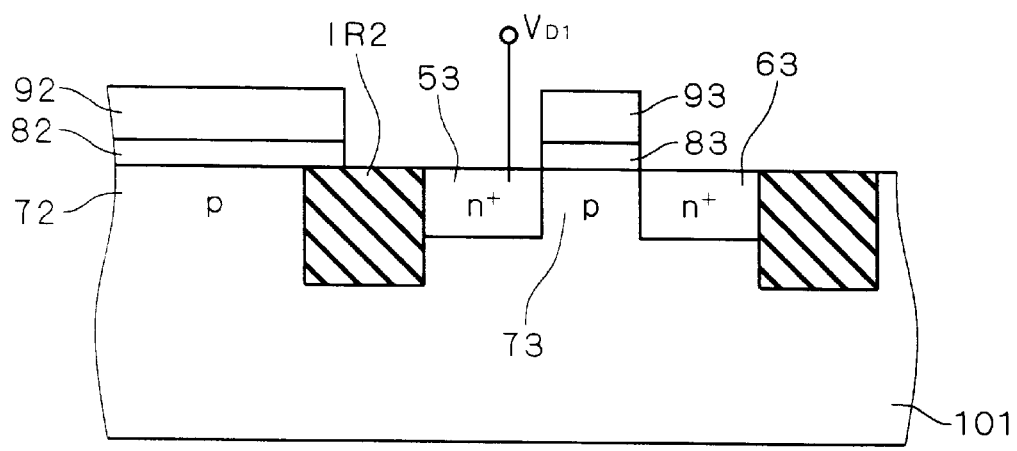
FIG. 9 illustrates a sectional structure of the modification 3 of the MOS transistor according to the first embodiment of the present invention.

FIG. 9 is a sectional view taken along the line X—X in FIG. 8. As shown in FIG. 9, the drain region 53 of the MOS transistor Q22 formed on a bulk silicon substrate 101 is opposed to the channel region 72 of the MOS transistor Q21 through the element isolation film IR2 formed by a silicon oxide film containing fluorine. The element isolation film IR2 is reduced in relative dielectric constant, and hence a drain electric field passing through the element isolation film IR2 and reaching the channel region 72 can be suppressed when a drain voltage $V_{D1}$ is applied to the drain region 53 even if the distance between the MOS transistors Q21 and Q22, i.e., a distance L shown in FIG. 8 is short, for inhibiting induction of electrons on an edge portion of the channel region 72 and reducing edge leakage resulting from such electrons.

While each of Japanese Patent Laying-Open Gazettes Nos. 5-47726 (1993), 5-21822 (1993) and 3-149821 (1991) describes introduction of fluorine into a buried oxide film, the technique described in each of these gazettes sediments fluorine on an SOI layer side of the buried oxide film and reduces interfacial levels of the SOI layer and the buried oxide film. None of the above gazettes recognizes the DIBL effect or edge leakage as a subject, and discloses or suggests suppression of the DIBL effect or reduction of edge leakage, as a matter of course. Suppression of the DIBL effect and reduction of edge leakage according to the present invention cannot be attained by sedimenting fluorine on the SOI layer side, and this is the evidence that suppression of the DIBL effect or reduction of edge leakage is not recognized as a subject.

While Japanese Patent Laying-Open Gazette No. 9-246265 (1997) describes a technique of introducing fluorine into an element isolation oxide film provided on a bulk silicon substrate, the technique described in this gazette aims at reducing the thickness of the element isolation oxide film by reducing the relative dielectric constant and reducing a leakage current of the element resulting from crystal defects. In the present invention, on the other hand, reduction of a leakage current, referred to as edge leakage, not resulting from crystal defects but occurring in another mechanism (resulting from electrical induction) is recognized as the subject, for reducing edge leakage by employing an element isolation oxide film containing fluorine for isolating MOS transistors from each other. Edge leakage is a current absolutely different in type from the leakage current resulting from crystal defects, and is a phenomenon recognized in the structure of isolating MOS transistors from each other. However, Japanese Patent Laying-Open Gazette No. 9-246265 does not recognize the edge leakage as a subject, and has neither disclosure nor suggestion on reduction of edge leakage, as a matter of course.

<B. Second Embodiment>
<B-1. Device Structure>

Figure 10:
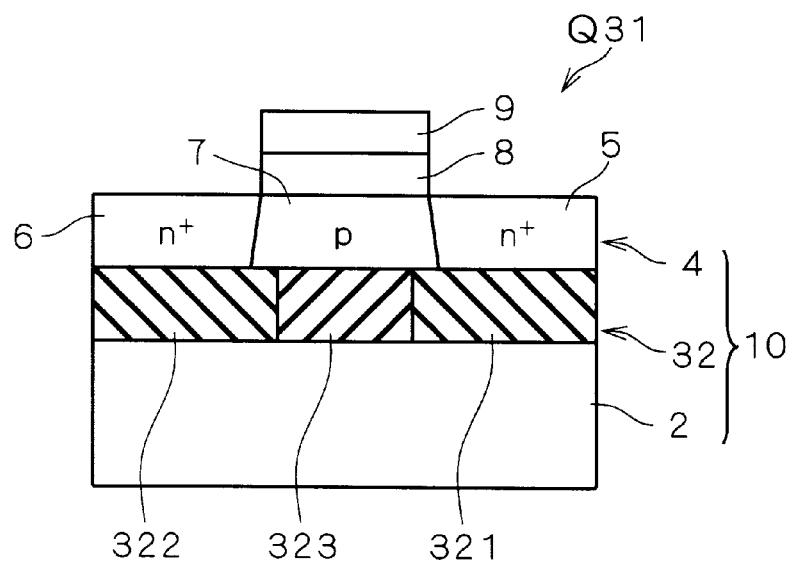
FIG. 10 illustrates a sectional structure of a MOS transistor according to a second embodiment of the present invention.

FIG. 10 typically shows a sectional structure of a MOS transistor Q31 formed on an SOI substrate 10 according to a second embodiment of the present invention.

The SOI substrate 10 has a buried oxide film 32 formed on a silicon substrate 2 and an SOI layer 4 formed on the buried oxide film 32. The SOI layer 4 is provided therein with a channel region 7 as well as a drain region 5 and a source region 6 arranged on both sides of the channel region 7, while a gate electrode 9 is arranged on the channel region 7 through a gate insulating film 8 to form the MOS transistor Q31. The MOS transistor Q31 is an n-channel transistor.

The buried oxide film 32 is formed by fluorine-containing regions (first and second fluorine-containing regions) 321 and 322 provided in regions corresponding to lower portions of the drain region 5 and the source region 6 respectively and formed by silicon oxide films substantially uniformly containing fluorine (F) and a normal region 323 provided in a region corresponding to a lower portion of the channel region 7 and formed by a conventional silicon oxide film containing no fluorine.

The fluorine-containing regions 321 and 322 are reduced in relative dielectric constant as compared with the normal region 323 having a relative dielectric constant of about 3.9.

The fluorine concentration of the fluorine-containing regions 321 and 322 is set at any level in the range of $1 \times 10^{19}$ to $1 \times 10^{22}$ cm$^{-3}$ substantially over the whole areas.

<B-2. Function/Effect>

Thus, the buried oxide film 32 has the normal region 323 formed by a conventional silicon oxide film containing no fluorine in the region corresponding to the lower portion of the channel region 7, whereby potential fluctuation of the channel region 7 can be suppressed similarly to the prior art.

Figure 11:
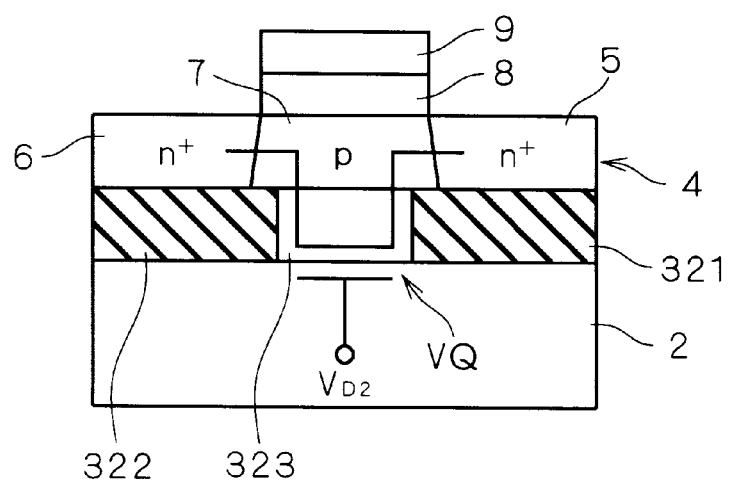
FIG. 11 illustrates the function/effect of the MOS transistor according to the second embodiment of the present invention.

This effect is described with reference to FIG. 11. FIG. 11 illustrates a virtual MOS transistor VQ in correspondence to the structure of the MOS transistor Q31 shown in FIG. 10. Assuming that the silicon substrate 2 is a gate electrode and the normal region 323 is a gate oxide film in FIG. 11, it follows that the potential of the channel region 7 also changes when the potential $V_{D2}$ of the silicon substrate 2 changes, similarly to an ordinary MOS transistor.

When fixing the potential of the silicon substrate 2, therefore, an effect of fixing the potential of the channel region 7 is attained to some extent.

In order to further ensure this effect, the buried oxide film 32 must be increased in relative dielectric constant at least in the portion corresponding to the lower portion of the channel region 7, and the normal region 323 is structured for this purpose. The relative dielectric constant of the normal region 323 is about 3.9, which is higher than that of the fluorine-containing regions 321 and 322.

The potential of the silicon substrate 2 is generally fixed to 0 V, and hence influence thereof is exerted to the channel region 7 through the normal region 323, so that potential fluctuation of the channel region 7 can be suppressed.

Thus, according to the structure shown in FIG. 10, the DIBL effect can be reduced by providing the normal region 323 in the vicinity of the portion immediately under the channel for increasing the potential fixing effect and providing the fluorine-containing regions 321 and 322 in the vicinity of the portions immediately under the source/drain junctions for suppressing an electric field sneaking up from the drain region through the buried oxide film 32. The DIBL effect can be minimized by optimizing the dimensions of the normal region 323.

In place of providing the normal region 323, fluorine may be introduced into the portion of the buried oxide film 32 corresponding to the lower portion of the channel region 7 for minimizing the DIBL effect by effectively utilizing the effect of suppressing the electric field sneaking up from the drain region 5 and the effect of fixing the potential of the silicon substrate 2.

In other words, it is possible to attain the effect of suppressing the DIBL effect and the effect of fixing the potential of the channel region 7 in a well-balanced manner by setting the relative dielectric constant of the portion of the buried oxide film 32 corresponding to the lower portion of the channel region 7 to an intermediate level between the relative dielectric constant of the fluorine-containing regions 321 and 322 and that of an ordinary silicon oxide film.

Also when employing the structure of the MOS transistor Q31, influence by an electric field from an adjacent element can be suppressed by introducing fluorine into an element isolation film between the MOS transistor Q31 and the adjacent element, as a matter of course.

<B-3. Manufacturing Method>

A method of manufacturing the MOS transistor Q31 is now described with reference to FIGS. 12 to 22 showing manufacturing steps in order.

Figure 12:
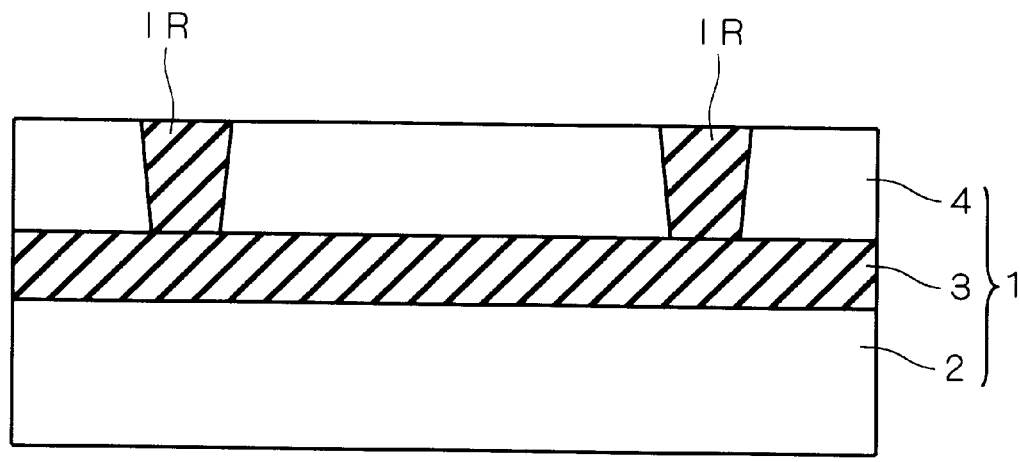
FIGS. 12 to 22 illustrate steps of manufacturing the MOS transistor according to the second embodiment of the present invention.

First, the SOI substrate 1 having the buried oxide film 3 formed on the silicon substrate 2 and the SOI layer 4 formed on the buried oxide film 3 is prepared and trench-type element isolation films IR reaching the main surface of the buried oxide film 3 from that of the SOI layer 4 are formed as shown in FIG. 12. The element isolation films IR may be formed by a conventional method. For example, an oxide film for surface protection is formed on the main surface of the SOI layer 4, and a nitride film or the like is formed thereon for patterning a mask for trench formation. The element isolation films IR can be obtained by providing trenches on the SOI layer 4 in coincidence with the mask and embedding oxide films formed by CVD (chemical vapor deposition) or the like in the trenches.

Figure 13:
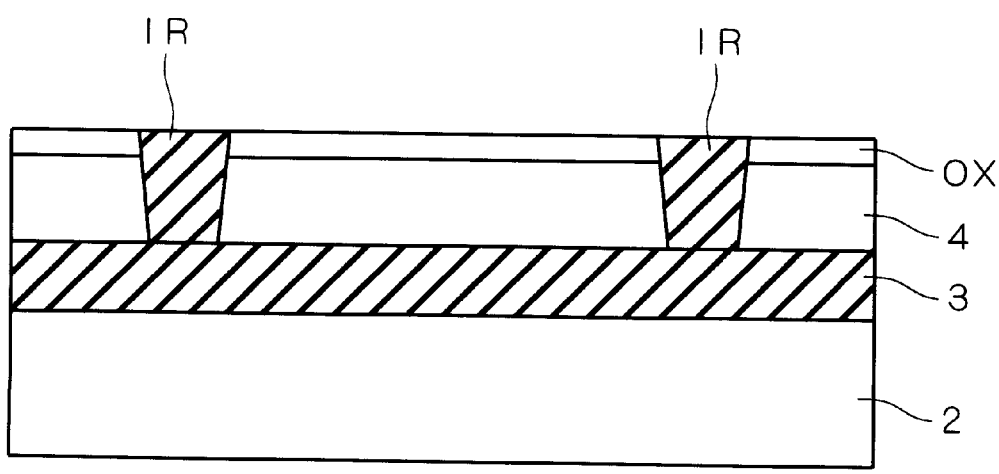

In the step shown in FIG. 13, a thermal oxide film OX is formed on the main surface of the SOI layer 4 under a temperature condition of 700 to 1000° C. The thermal oxide film OX defines a gate oxide film later.

Figure 14:
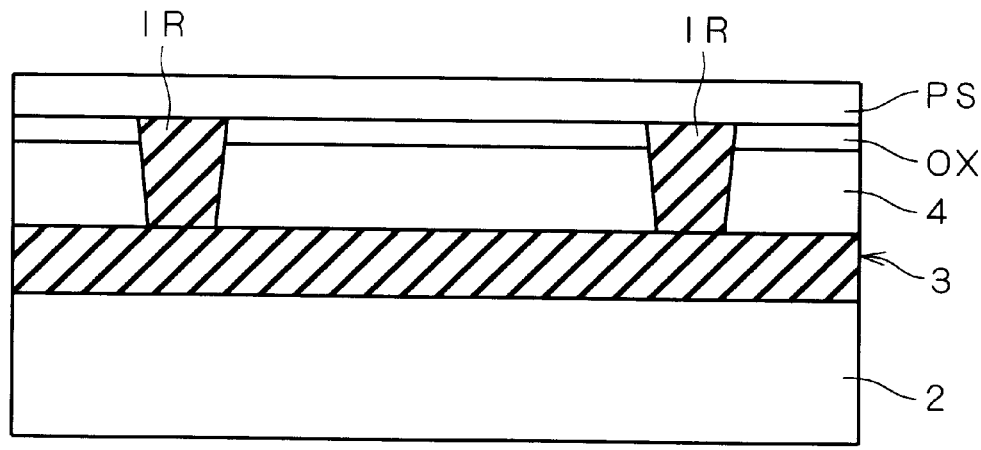

In the step shown in FIG. 14, a doped polysilicon layer PS containing a p-type impurity is stacked on the thermal oxide film OX by LPVCD (low-pressure CVD) under a temperature condition of 500 to 700° C.

Figure 15:
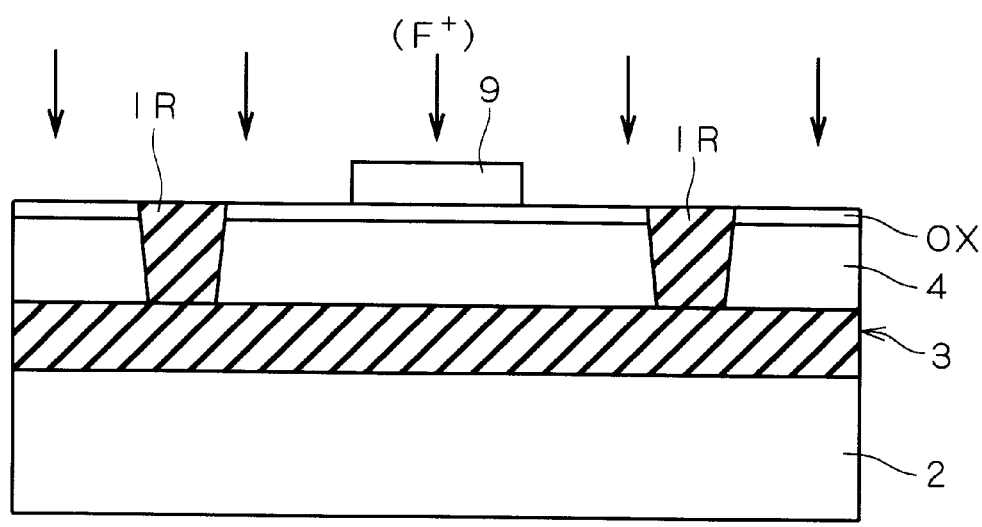
Figure 16:
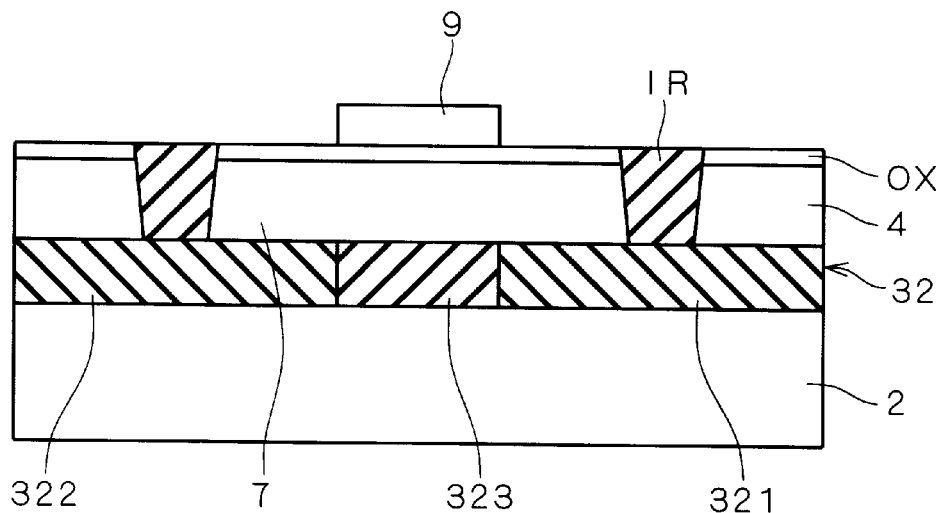

Then, the gate electrode 9 is formed by patterning the doped polysilicon layer PS, and fluorine ions are implanted into the buried oxide film 3 through the gate electrode 9 serving as a mask in the step shown in FIG. 15. The fluorine ions are implanted in a dose of $1 \times 10^{14}$ to $1 \times 10^{19}$ cm$^{-2}$ with energy of 130 keV to 300 keV so that the concentration peak position is at the center of the buried oxide film 3. Due to the presence of the gate electrode 9, no fluorine is injected into the portion of the buried oxide film 3 corresponding to the lower portion of the gate electrode 9 but the portion corresponding to the lower portion of the gate electrode 9 defines the normal region 323 which is a conventional silicon oxide film while the portions on both sides thereof define the fluorine-containing regions 321 and 322, to obtain the buried oxide film 32 as shown in FIG. 16.

Figure 17:
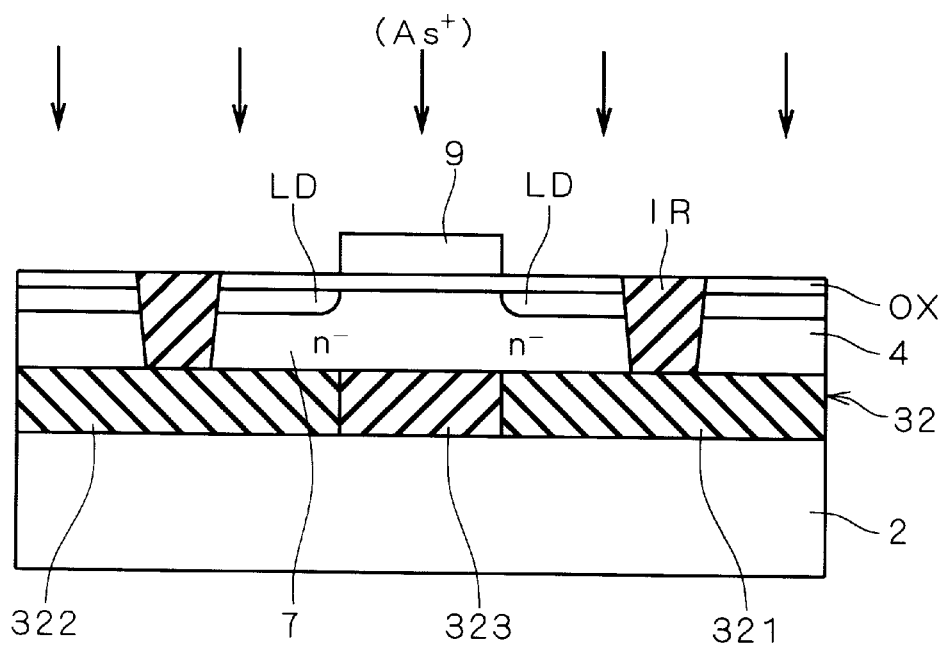

In the step shown in FIG. 17, arsenic (As) is ion-implanted into the SOI layer 4 through the gate electrode 9 serving as a mask. The arsenic ions are implanted in a dose of $1 \times 10^{13}$ to $1 \times 10^{14}$ cm$^{-2}$, for forming the so-called LDD (lightly doped drain) layers LD.

Figure 18:
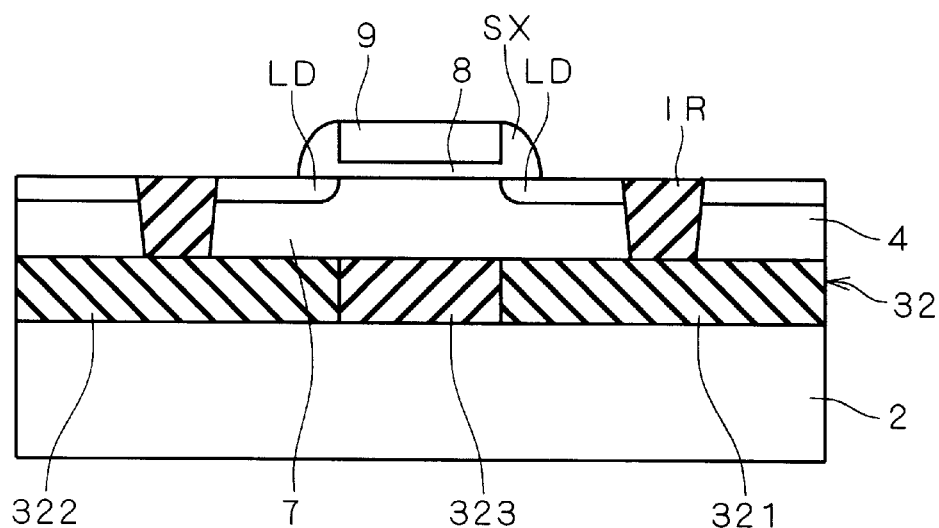

Then, an oxide film is formed by CVD to cover the thermal oxide film OX and the gate electrode 9 and thereafter anisotropically etched back for forming side wall oxide films SX on side walls of the gate electrode 9, as shown in FIG. 18. At this time, the thermal oxide film OX is also removed except the portion under the gate electrode 9, to define the gate oxide film 8 under the gate electrode 9.

Figure 19:
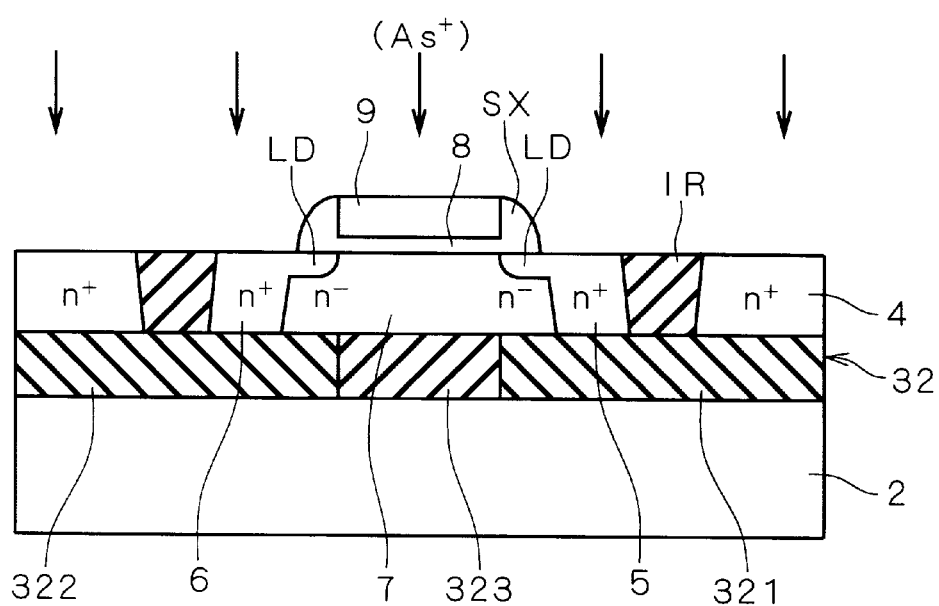

In the step shown in FIG. 19, arsenic (As) is ion-implanted into the SOI layer 4 through the gate electrode 9 and the side wall oxide films SX serving as masks. The arsenic ions are implanted in a dose of $1 \times 10^{15}$ to $1 \times 10^{16}$ cm$^{-2}$, and finally annealing is performed at a temperature of 800 to 1000° C. for forming the drain region 5 and the source region 6.

At this time, fluorine in the fluorine-containing regions 321 and 322 of the buried oxide film 32 is uniformly diffused. At this time, fluorine is also diffused in the element isolation films IR, which in turn are reduced in relative dielectric constant due to the introduction of fluorine. The maximum fluorine concentration in the element isolation films IR is preferably at any level in the range of $1 \times 10^{19}$ to $1 \times 10^{22}$ cm$^{-3}$. If the fluorine concentration in the element isolation films IR cannot be sufficiently obtained only by diffusion through the aforementioned steps, the oxide films for defining the element isolation films IR may previously contain fluorine in the step shown in FIG. 12.

Figure 20:
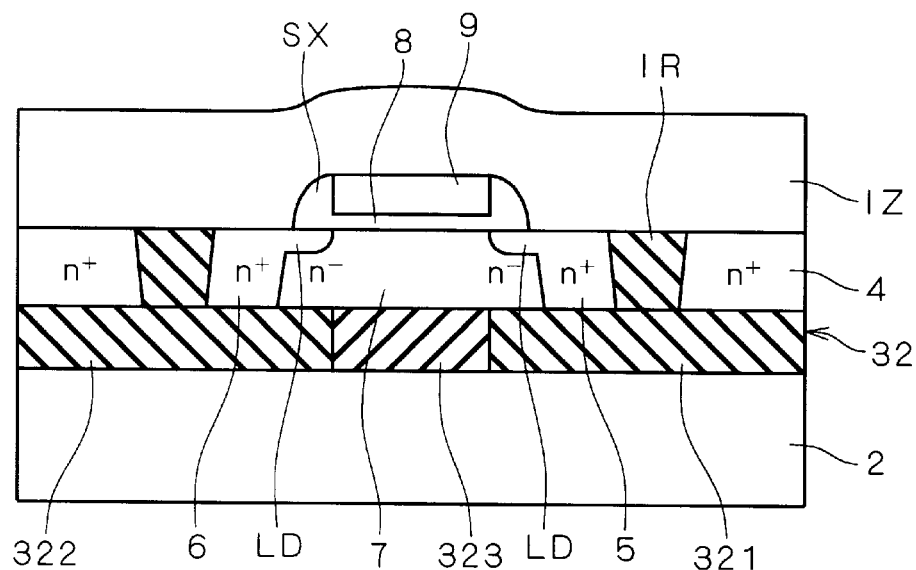

Then, the interlayer isolation film IZ of about 1 μm in thickness is formed by CVD to cover the overall SOI layer 4, as shown in FIG. 20. The interlayer isolation film IZ is formed by a silicon oxide ($SiO_2$) film, a TEOS (tetraethyl orthosilicate) film, a PSG (phosphosilicate glass) film, a BPSG (borophosphosilicate glass) film or the like.

Figure 21:
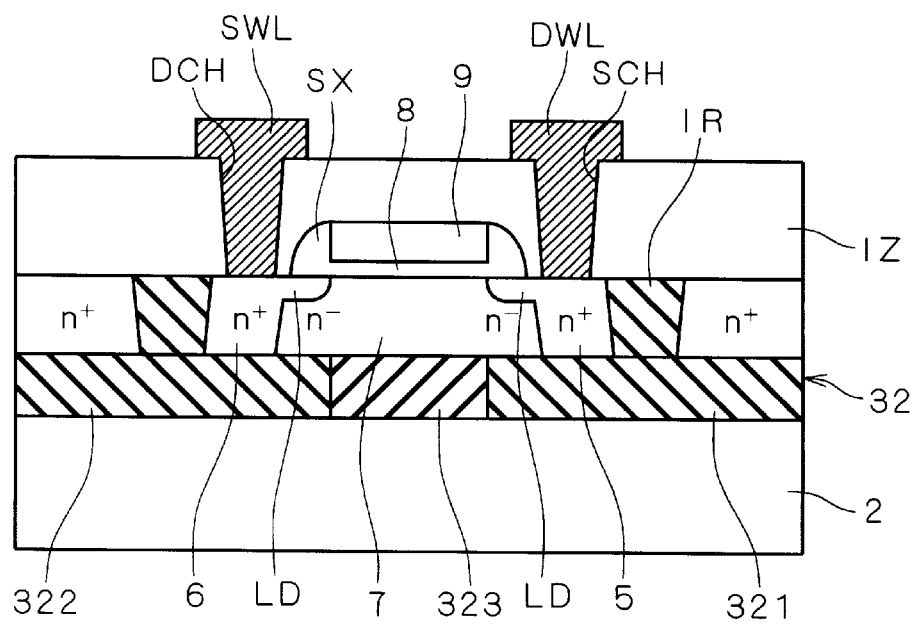

Then, the interlayer isolation film IZ is flattened and thereafter the contact holes DCH and SCH reaching the surfaces of the drain region 5 and the source region 6 are formed through the interlayer isolation film IZ as shown in FIG. 21, and a conductive material such as aluminum or tungsten is buried in the contact holes DCH and SCH to form the drain wiring layer DWL and the source wiring layer SWL.

Figure 22:
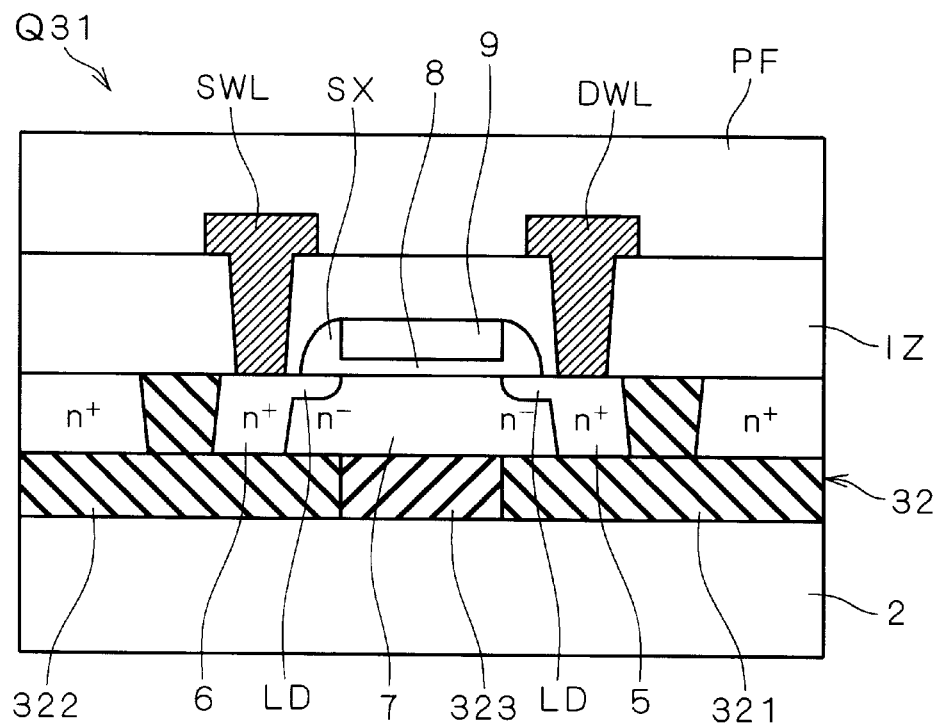

Finally, a protective film PF is formed by an oxide film or the like to cover the overall interlayer isolation film IZ as shown in FIG. 22, and hydrogen annealing is performed at a temperature of 400 to 450° C. thereby improving the film quality of each oxide film such as the protective film PF and forming the MOS transistor Q31.

FIG. 10 showing the MOS transistor Q31 omits illustration of the LDD layers LD, the side wall oxide films SX and the like for the purpose of simplification.

While the above description has been made with reference to an n-channel MOS transistor, this also applies to a p-channel MOS transistor.

While the above description has been made with reference to the method not injecting fluorine into the portion of the buried oxide film 3 corresponding to the lower portion of the gate electrode 9 but providing the normal region 323 which is a conventional silicon oxide film, fluorine may be selectively ion-implanted into the portion of the buried oxide film 3 corresponding to the lower portion of the channel region 7 in advance of the step shown in FIG. 12, for example, when introducing fluorine also into the portion (corresponding to the portion corresponding to the lower portion of the channel region 7) of the buried oxide film 3 corresponding to the lower portion of the gate electrode 9, as hereinabove described. In this case, the dose of fluorine injected into this portion is so set that the relative dielectric constant of the portion is at an intermediate level between the relative dielectric constant of the fluorine-containing regions 321 and 322 shown in FIG. 16 and that of an ordinary silicon oxide film.

<C. Third Embodiment>

Various methods of manufacturing the SOI substrate 10 having the buried oxide film 31 containing fluorine described with reference to the first embodiment are described as a third embodiment of the present invention.

<C-1. Method Utilizing High-Dose SIMOX>

SIMOX (separation by implanted oxygen) is a method of forming a buried oxide film in a silicon substrate by implanting oxygen ions into the silicon substrate, and fluorine can be introduced into the buried oxide film by utilizing this method. Two methods of manufacturing an SOI substrate 10 by high-dose SIMOX are now described with reference to FIGS. 23 to 28 showing manufacturing steps in order.

<C-1-1. First Method>

Figure 23:
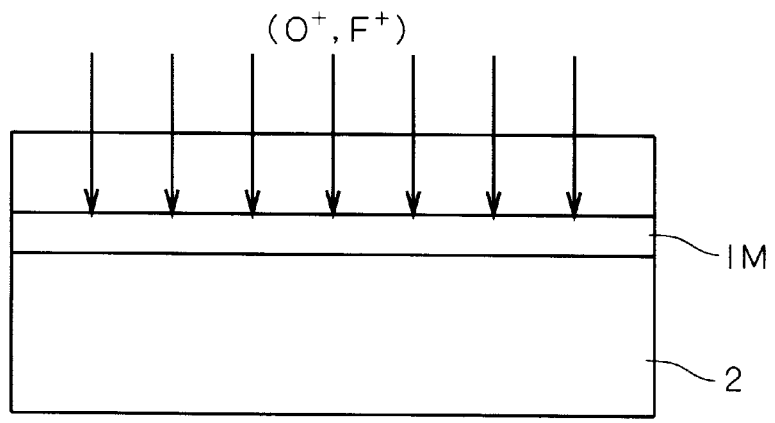
FIGS. 23 to 28 illustrate steps of manufacturing an SOI substrate by high-dose SIMOX.

First, a silicon substrate 2 is prepared and oxygen is ion-implanted with energy of 100 to 200 keV to reach a dose of $1\times10^{17}$ to $2\times10^{18}$ cm$^{-2}$ in the step shown in FIG. 23. Further, fluorine is ion-implanted with energy of 130 to 300 keV to reach a dose of $1\times10^{14}$ to $1\times10^{19}$ cm$^{-2}$ in the same range (Rp) as that of the oxygen ions under the aforementioned implantation conditions, for forming an ion-implanted region IM.

Figure 24:
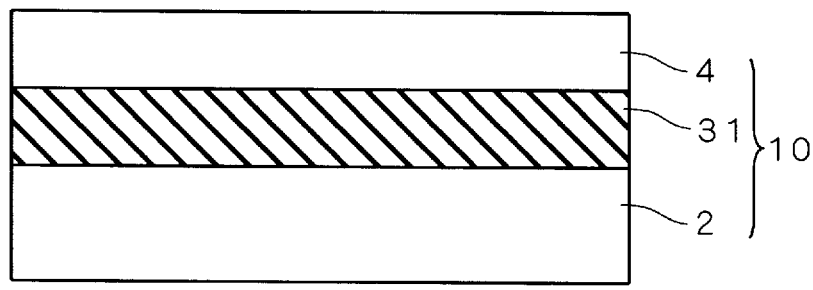

Thereafter heat treatment is performed under a temperature condition of 1000 to 1350° C. for diffusing oxygen and fluorine, thereby forming a buried oxide film 31 substantially uniformly containing fluorine over the whole area thereof, as shown in FIG. 24. At the same time, crystallinity of a silicon layer on the buried oxide film 31 is recovered to form an SOI layer 4, thereby completing the SOI substrate 10.

In this step, fluorine and oxygen injected into silicon layers in the upper and lower portions of the ion-implanted region IM also contribute to formation of the buried oxide film 31.

The implantation range of the fluorine ions is equalized with that of the oxygen ions, in order to concentrate the fluorine ions and the oxygen ions in the same depth and thermally diffusing these ions thereby obtaining the buried oxide film 31 containing fluorine uniformly distributed over the whole area.

When forming an SOI substrate including a buried oxide film 31 having a thickness of 4000 Å (400 nm) and a silicon layer (i.e., an SOI layer), provided on the buried oxide film 31, having a thickness of 1700 Å (170 nm), for example, injection energy for fluorine is set to about 220 keV, in order to inject fluorine into a central portion of the buried oxide film.

In order to obtain a buried oxide film 31 containing fluorine uniformly distributed over the whole area, fluorine may be injected in two stages.

In other words, the position for forming the buried oxide film 31 is assumed for performing ion implantation with energy for injecting fluorine into a position closer to the upper portion of the buried oxide film 31 as a first stage, and performing ion implantation with energy injecting fluorine into a position closer to the lower portion of the buried oxide film 31 as a second stage.

When forming an SOI substrate including a buried oxide film 31 having a thickness of 4000 Å and a silicon layer (i.e., an SOI layer), provided on the buried oxide film 31, having a thickness of 1700 Å, for example, fluorine is injected with energy of 160 keV as a first stage, and then injected with energy of 260 keV as a second stage.

<C-1-2. Second Method>

While the above description has been made with reference to the buried oxide film 31 formed by injecting oxygen and fluorine and thereafter performing heat treatment in common thereby simultaneously diffusing oxygen and fluorine, heat treatment may be individually performed as described below.

Figure 25:
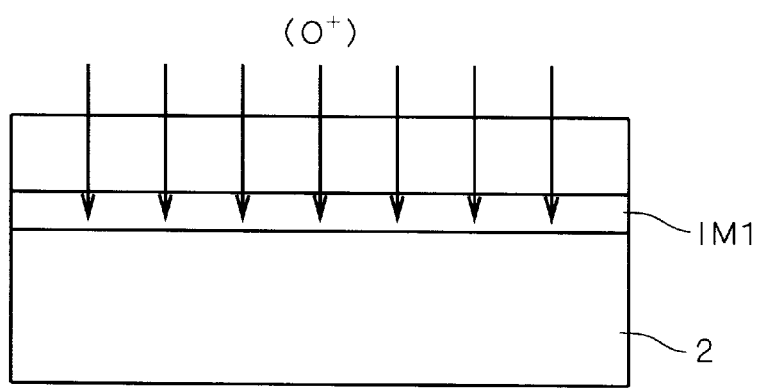

First, a silicon substrate 2 is prepared and oxygen is ion-implanted with energy of 100 to 200 keV to reach a dose of $1\times10^{17}$ to $2\times10^{18}$ cm$^{-2}$ in the step shown in FIG. 25, for forming an ion-implanted region IM1.

Figure 26:
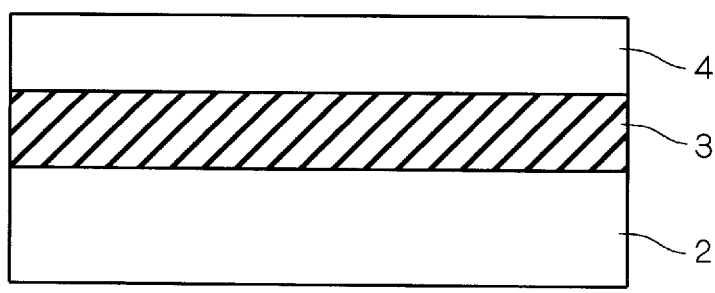

Thereafter heat treatment is performed under a temperature condition of 1000 to 1350° C. for diffusing oxygen, thereby forming a buried oxide film 3 (about 400 nm in thickness), which is identical to the conventional one, as shown in FIG. 26. At the same time, crystallinity of a silicon layer on the buried oxide film 3 is recovered to form an SOI layer 4.

Figure 27:
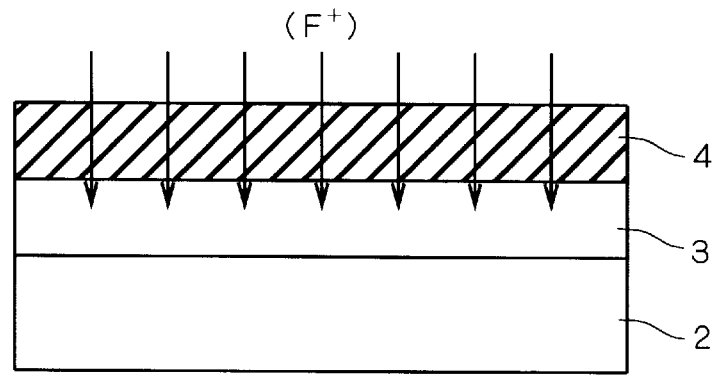

In the step shown in FIG. 27, fluorine is ion-implanted into the buried oxide film 3 with energy of 130 to 300 keV to reach a dose of $1\times10^{14}$ to $1\times10^{19}$ cm$^{-2}$ in the same range (Rp) as that of the oxygen ions under aforementioned implantation conditions.

Fluorine may be injected by assuming the position for forming a buried oxide film 31, performing ion implantation with energy for injecting fluorine into a position closer to the upper portion of the buried oxide film 31 as a first stage and then performing ion implantation with energy for injecting fluorine into a position closer to the lower portion of the buried oxide film 31 as a second stage.

Figure 28:
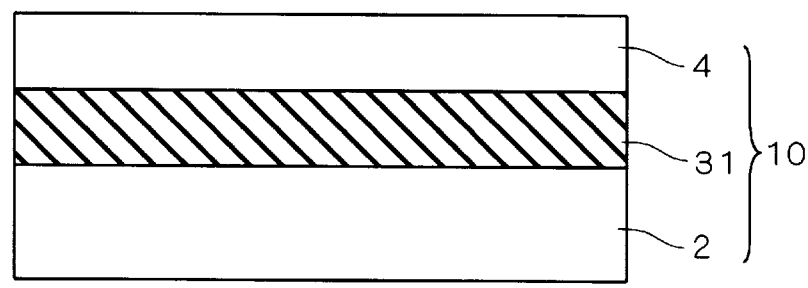

Finally, heat treatment is performed under a temperature condition of 1000 to 1350° C. for uniformly diffusing fluorine, thereby obtaining the buried oxide film 31 containing fluorine uniformly distributed over the whole area, as shown in FIG. 28. It follows that crystallinity of the SOI layer 4 is recovered at the same time.

<C-2. Method Utilizing Low-Dose SIMOX>

Low-dose SIMOX, which is a method of forming a buried oxide film with an oxygen dose of about ¼ that of high-dose SIMOX, has such disadvantages that the buried oxide film has a small thickness, includes pinholes and has a low withstand voltage. A technique proposed for overcoming these disadvantages is ITOX (internal thermal oxidation). Fluorine can be introduced into the buried oxide film by utilizing this technique. Two methods of manufacturing an SOI substrate 10 by low-dose DIMOX to which ITOX is applied are now described with reference to FIGS. 29 to 36 showing manufacturing steps in order.

<C-2-1. First Method>

Figure 29:
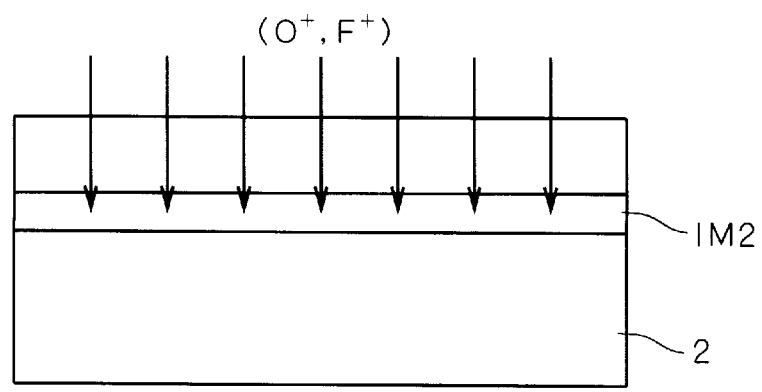

First, a silicon substrate 2 is prepared and oxygen is ion-implanted with energy of 100 to 200 keV to reach a dose of about $4\times10^{17}$ cm$^{-2}$ in the step shown in FIG. 29. Further, fluorine is ion-implanted with energy of 130 to 300 keV to reach a dose of $1\times10^{14}$ to $1\times10^{19}$ cm$^{-2}$ in the same range (Rp) as that of oxygen ions under the aforementioned implantation conditions, for forming an ion-implanted region IM2.

Figure 30:
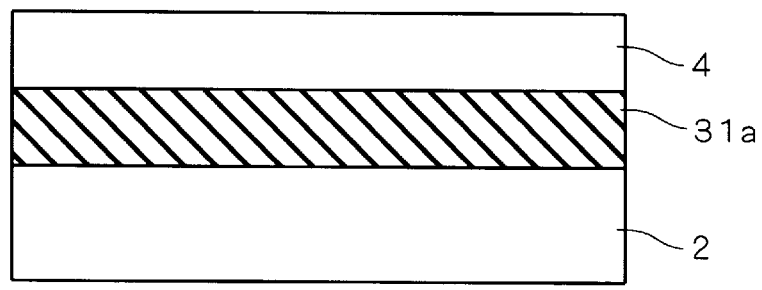

Thereafter heat treatment is performed under a temperature condition of 1000 to 1350° C. for diffusing oxygen and fluorine, thereby forming a buried oxide film 31a (about 80 nm in thickness) substantially uniformly containing fluorine over the whole area thereof, as shown in FIG. 30. At the same time, crystallinity of a silicon layer on the buried oxide film 31a is recovered to form an SOI layer 4.

In this step, fluorine and oxygen injected into silicon layers in the upper and lower portions of the ion-implanted region IM2 also contribute to formation of the buried oxide film 31a.

The implantation range of the fluorine ions is equalized with that of the oxygen ions, in order to concentrate the fluorine ions and the oxygen ions in the same depth and thermally diffusing these ions thereby obtaining the buried oxide film 31a containing fluorine uniformly distributed over the whole area.

Figure 31:
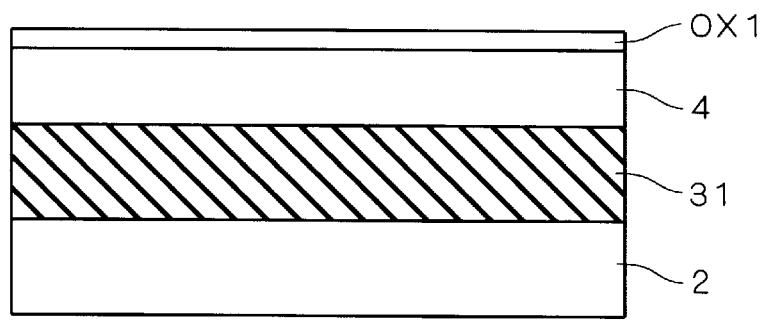

In the step shown in FIG. 31, heat treatment is performed under the temperature condition of 1000 to 1350° C. again for reducing defect density of the buried oxide film 31a, thereby finally obtaining a buried oxide film 31 having excellent film quality. At this time, heating is performed under a condition for forming a thermal oxide film OX1 on the surface of the substrate 2, e.g., in an oxygen atmosphere, so that oxygen consumed in formation of the oxide film OX1 is partially diffused also into the substrate 2 and internal oxidation is caused on the buried oxide film 31a to increase the thickness. Therefore, the thickness of the final buried oxide film 31 is about 100 nm. The thermal oxide film OX1 is finally removed.

Fluorine may be injected by assuming the position for forming the buried oxide film 31, performing ion implantation with energy for injecting fluorine into a position closer to the upper portion of the buried oxide film 31 as a first stage and then performing ion implantation with energy for injecting fluorine into a position closer to the lower portion of the buried oxide film 31 as a second stage.

<C-2-2. Second Method>

While the above description has been made with reference to the buried oxide film 31 formed by injecting oxygen and fluorine and thereafter performing heat treatment in common thereby simultaneously diffusing oxygen and fluorine, heat treatment may be individually performed as described below.

Figure 32:
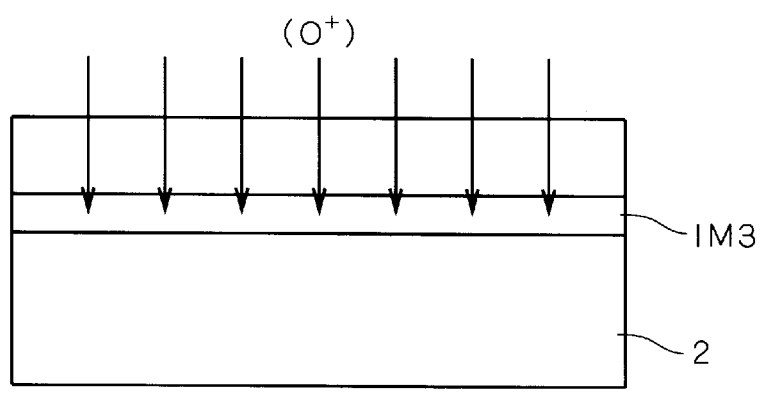

First, a silicon substrate 2 is prepared and oxygen is ion-implanted with energy of 100 to 200 keV to reach a dose of about $4 \times 10^{17}$ cm$^{-2}$ in the step shown in FIG. 32, for forming an ion-implanted region IM3.

Figure 33:
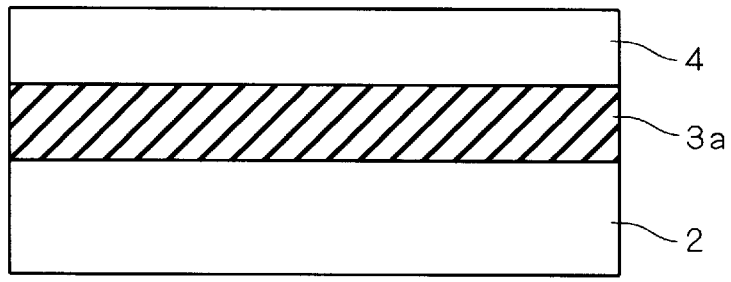

Thereafter heat treatment is performed under a temperature condition of 1000 to 1350° C. for diffusing oxygen, thereby forming a buried oxide film 3a (about 80 nm in thickness) as shown in FIG. 33. Crystallinity of a silicon layer on the buried oxide film 3a is recovered at the same time, for forming an SOI layer 4.

Figure 34:
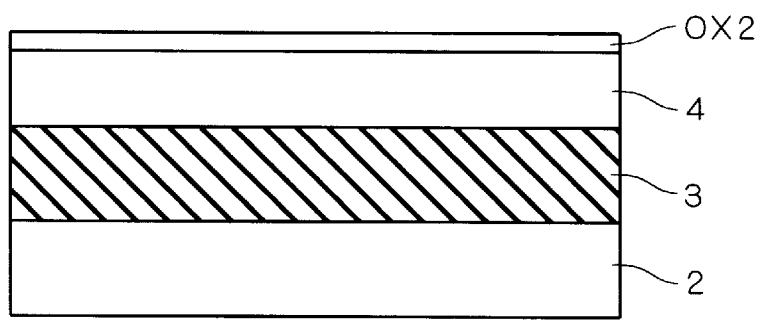

In the step shown in FIG. 34, heat treatment is performed under a temperature condition of 1000 to 1350° C. for reducing defect density of the buried oxide film 3a and finally obtaining a buried oxide film 3 having excellent film quality. At this time, a thermal oxide film OX2 is formed on the surface of the substrate 2, while oxygen consumed in formation of the oxide film OX2 is partially diffused into the substrate 2, and internal oxidation is caused on the buried oxide film 3a to increase the thickness. Therefore, the thickness of the final buried oxide film 3 is about 100 nm.

Figure 35:
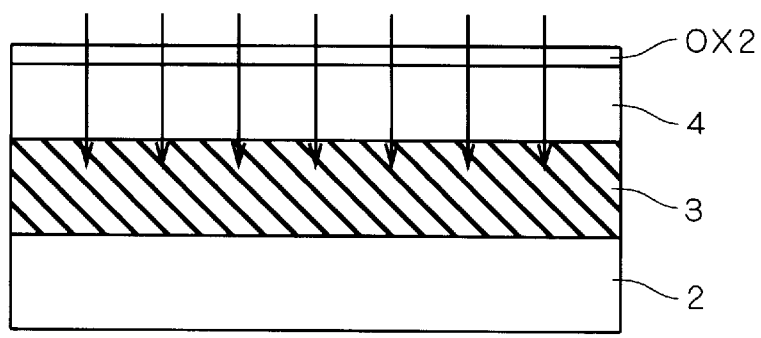

In the step shown in FIG. 35, fluorine is ion-implanted into the buried oxide film 3 with energy of 130 to 300 keV to reach a dose of $1 \times 10^{14}$ to $1 \times 10^{19}$ cm$^{-2}$ in the same range (Rp) as that of oxygen ions under the aforementioned implantation conditions.

Finally, heat treatment is performed under a temperature condition of 1000 to 1350° C. for uniformly diffusing fluorine, thereby obtaining a buried oxide film 31 (about 100 nm in thickness) containing fluorine uniformly distributed over the whole area, as shown in FIG. 30. It follows that crystallinity of the SOI layer 4 is recovered at the same time.

Fluorine may be injected by assuming the position for forming the buried oxide film 31, performing ion implantation with energy for injecting fluorine into a position closer to the upper portion of the buried oxide film 31 as a first stage and then performing ion implantation with energy for injecting fluorine into a position closer to the lower portion of the buried oxide film 31 as a second stage.

<C-3. Method Utilizing Smart Cut Technique>

A smart cut technique, which is a technique of implanting hydrogen (H) ions into a silicon substrate for forming a defect layer in a portion deeper than the surface, causing cracking on a position having the highest concentration of injected hydrogen and exfoliating a silicon layer, can be applied to a bonding wafer for manufacturing an SOI substrate. An SOI substrate manufactured by this method is called a Unibond substrate with a trade name of SOITEC (Silicon On Insulator Technologies) developing this technique. Two methods of manufacturing an SOI substrate 10 through the smart cut technique are now described with reference to FIGS. 37 to 48 showing manufacturing steps in order.

<C-3-1. First Method>

First, a silicon substrate 21 is prepared and a thermal oxide film OX3 is formed on its main surface as shown in FIG. 37.

In the step shown in FIG. 38, fluorine is ion-implanted into the thermal oxide film OX3 to reach a dose of $1 \times 10^{14}$ to $1 \times 10^{19}$ cm$^{-2}$. Injection energy is so set that the range (Rp) of fluorine ions is about half the thickness of the thermal oxide film OX3, in order to uniformly diffuse injected fluorine in the thermal oxide film OX3 in a later step of high-temperature annealing. When the thickness of the thermal oxide film OX3 is 400 nm (4000 Å), for example, injection energy is set to 120 to 130 keV, in order to implant fluorine ions into a central portion of the thermal oxide film OX3.

Fluorine may be injected in two stages by performing ion implantation into a position closer to the upper portion of the thermal oxide film OX3 as a first stage and then performing ion implantation into a position closer to the lower portion of the thermal oxide film OX3 as a second stage. When the thickness of the thermal oxide film OX3 is 400 nm, for example, injection energy for the first stage may be set to 60 keV and that for the second stage may be set to 180 keV.

Figure 39:
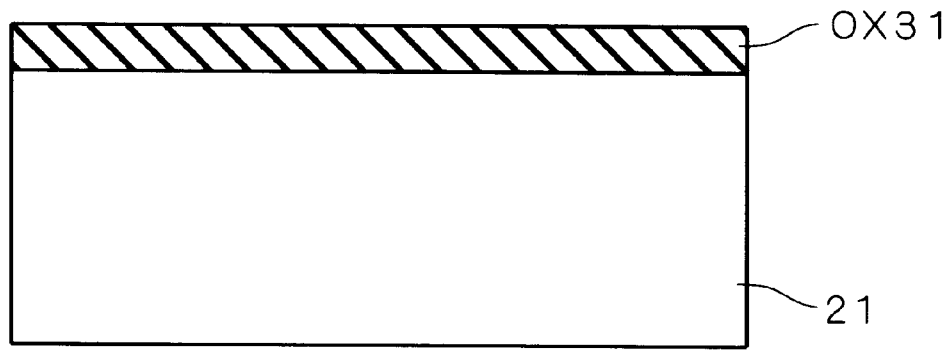

In the step shown in FIG. 39, heat treatment (high-temperature annealing) is performed under a temperature condition of 1000 to 1300° C. for uniformly diffusing fluorine in the thermal oxide film OX3, thereby forming an oxide film OX31 containing uniformly distributed fluorine.

Figure 40:
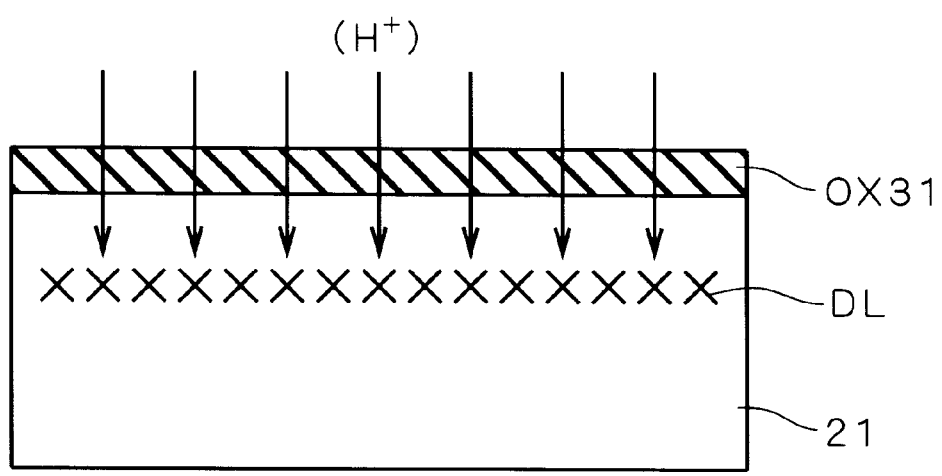

In the step shown in FIG. 40, hydrogen is ion-implanted into a position deeper than the interface between the oxide film OX31 and the silicon substrate 21 to reach a dose of $1 \times 10^{16}$ to $1 \times 10^{17}$ cm$^{-2}$. A defect layer DL is formed in the portion into which hydrogen ions are implanted.

Figure 41:
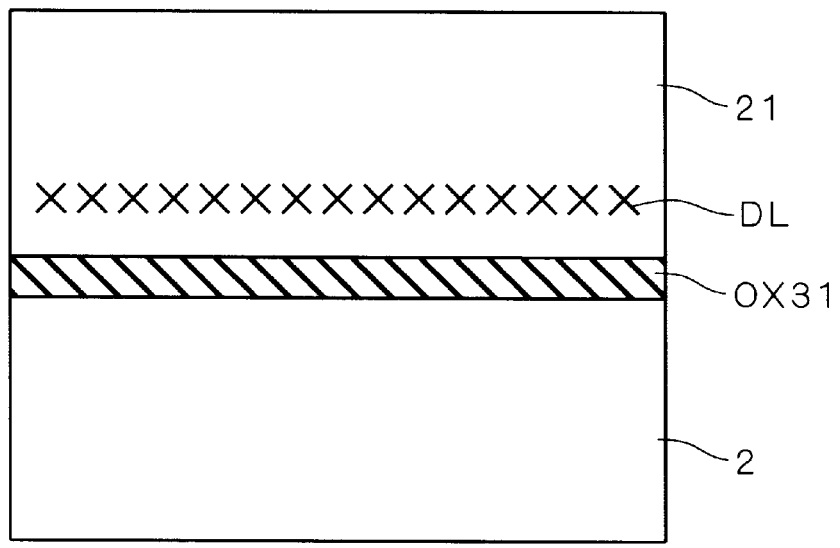

In the step shown in FIG. 41, the silicon substrate 21 is bonded with a separately prepared silicon substrate 2 so that the main surface of the silicon substrate 21 formed with the oxide film OX31 is opposed to that of the silicon substrate 2.

Figure 42:
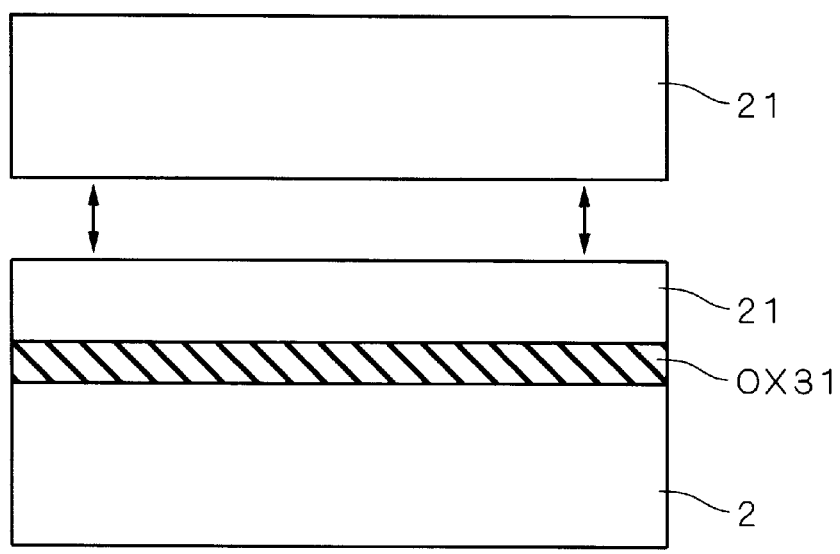

In the step shown in FIG. 42, heat treatment is performed under a temperature condition of 400 to 700° C. for separating an unnecessary portion (opposite to the oxide film OX31) of the silicon substrate 21 through the defect layer DL. Then, heat treatment is performed under a temperature condition of about 1100° C., for strengthening bonding between the silicon substrate 21 and the silicon substrate 2.

Figure 43:
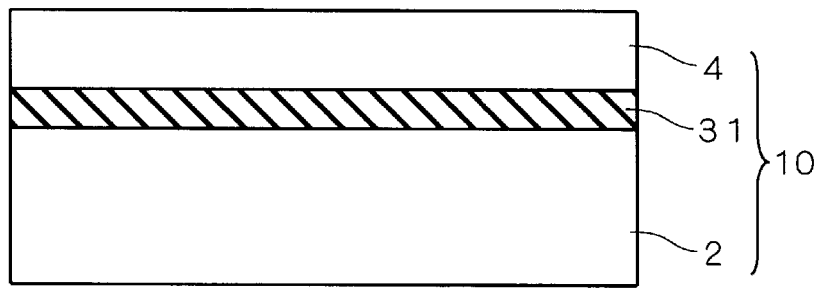

Finally, the remaining separated surface of the silicon substrate 21 is polished and reformed by hydrogen annealing, so that the remaining part of the silicon substrate 21 defines an SOI layer 4 and the oxide film OX31 uniformly containing fluorine defines the so-called buried oxide film 31, thereby completing the SOI substrate 10 as shown in FIG. 43.

While the above description has been made with reference to the method of forming the oxide film OX31 containing uniformly distributed fluorine by forming the thermal oxide film OX3, thereafter implanting fluorine ions into the thermal oxide film OX3 and uniformly diffusing fluorine in the thermal oxide film OX3 by high-temperature annealing, an oxide film 31 containing fluorine may be formed on the main surface of the silicon substrate 21 by CVD employing reactive gas containing fluorine, in place of the steps shown in FIGS. 37 to 39. The oxide film 31 containing fluorine may be formed under a temperature condition of 300 to 450° C. by plasma CVD, for example, while selecting any one of $NF_3$ gas, $CF_4$ gas and $C_2F_6$ gas as the reactive gas containing fluorine in addition to TEOS gas and oxygen gas.

<C-3-2. Second Method>

While the above description has been made with reference to the method of individually carrying out the heat treatment step for diffusing injected fluorine and the heat treatment step for separation after injection of hydrogen, these heat treatment steps may be simultaneously carried out as described below.

Figure 44:
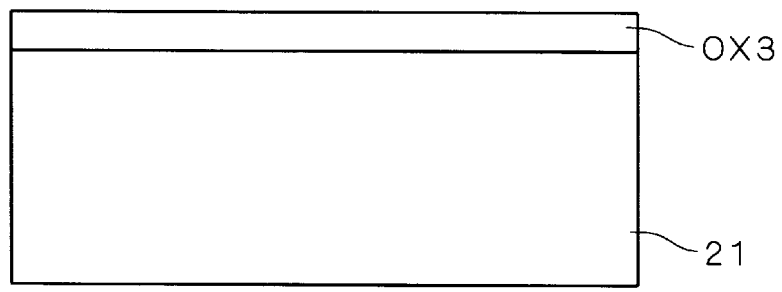

First, a silicon substrate 21 is prepared and a thermal oxide film OX3 is formed on the main surface thereof, as shown in FIG. 44.

Figure 45:
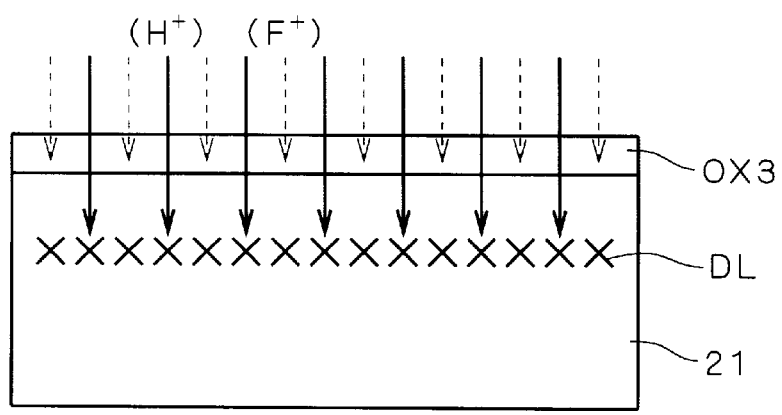

In the step shown in FIG. 45, fluorine is ion-implanted into the thermal oxide film OX3 to reach a dose of $1\times10^{14}$ to $1\times10^{19}$ cm$^{-2}$. Injection energy is so set that the range (Rp) of fluorine ions is about half the thickness of the thermal oxide film OX3.

Further, hydrogen is ion-implanted into a position deeper than the interface between the oxide film OX3 and the silicon substrate 21 to reach a dose of $1\times10^{16}$ to $1\times10^{17}$ cm$^{-2}$. A defect layer DL is formed in the portion into which hydrogen ions are implanted.

Figure 46:
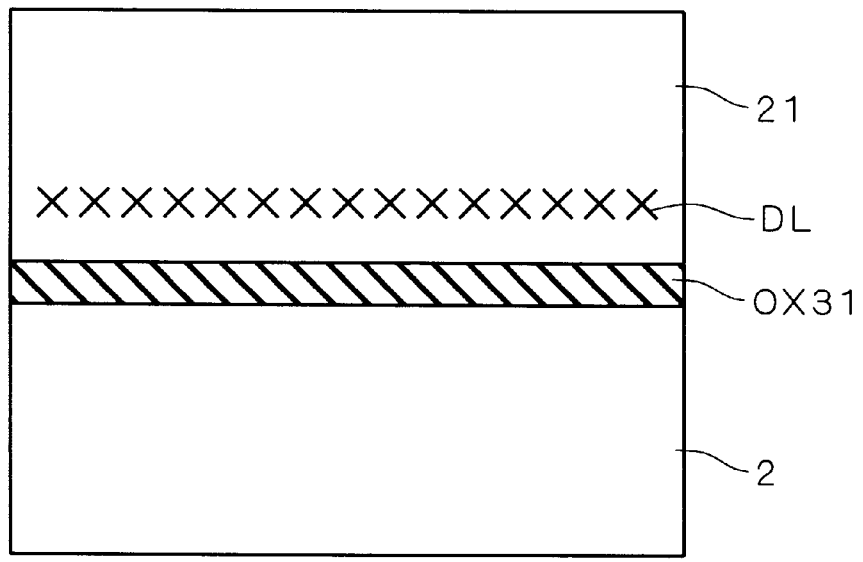

In the step shown in FIG. 46, the silicon substrate 21 is bonded with a separately prepared silicon substrate 2 so that the main surface of the silicon substrate 21 formed with the thermal oxide film OX3 is opposed to the main surface of the silicon substrate 2.

Figure 47:
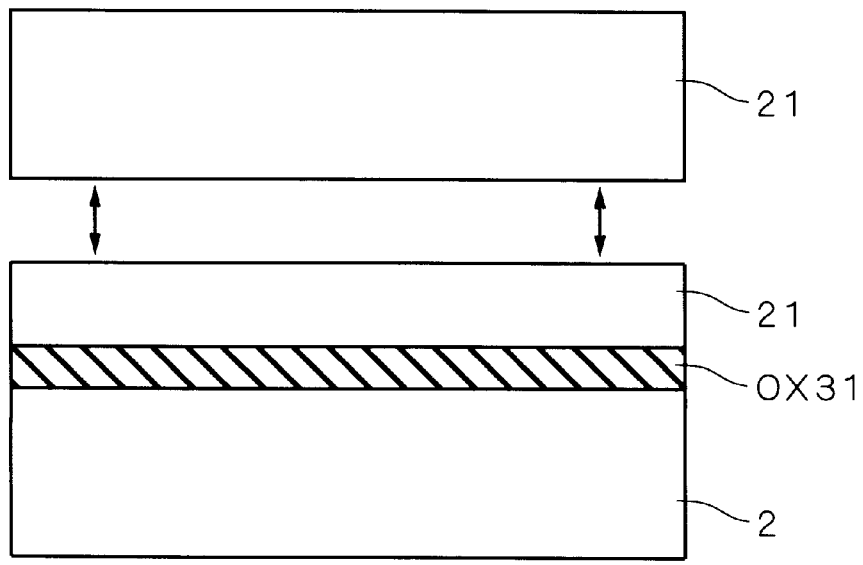

In the step shown in FIG. 47, heat treatment is performed under a temperature condition of 400 to 700° C. for exfoliating an unnecessary portion (portion opposite to the thermal oxide film OX3) of the silicon substrate 21 through the defect layer DL. Then, heat treatment (high-temperature annealing) is performed under a temperature condition of 1100 to 1300° C. for uniformly diffusing fluorine in the thermal oxide film OX3 thereby forming an oxide film OX31 containing uniformly distributed fluorine and strengthening bonding between the silicon substrate 21 and the silicon substrate 2.

Figure 48:
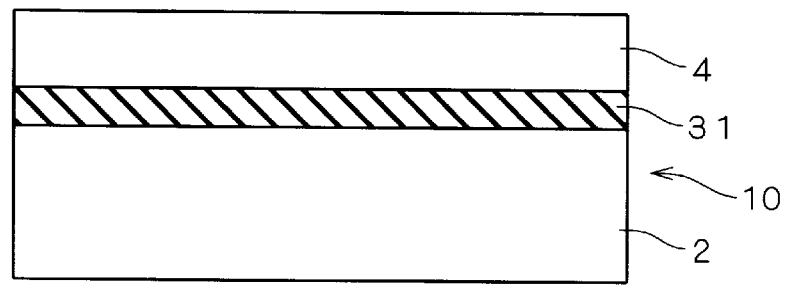

Finally, the remaining exfoliated surface of the silicon substrate 21 is polished and reformed by hydrogen annealing, so that the remaining part of the silicon substrate 21 defines an SOI layer 4 and the oxide film OX31 uniformly containing fluorine defines the so-called buried oxide film 31, thereby completing the SOI substrate 10 as shown in FIG. 48.

<C-4. Method Utilizing ELTRAN>

ELTRAN (Epitaxial Layer TRANsfer), one of techniques of manufacturing bonding substrates, is a technique of polishing/removing or exfoliating a silicon substrate through a porous silicon layer in place of the defect layer in the aforementioned smart cut technique. A method of manufacturing an SOI substrate 10 through the ELTRAN technique is now described with reference to FIGS. 49 to 55 showing manufacturing steps in order.

Figure 49:
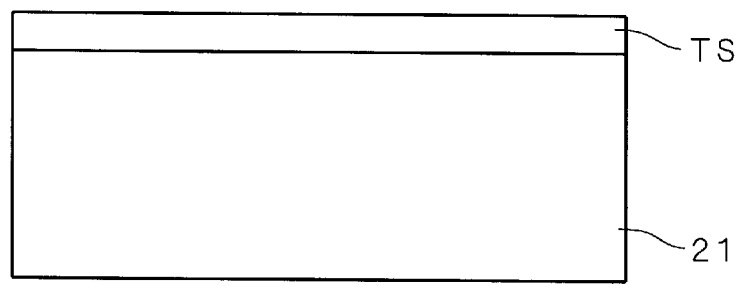
FIGS. 49 to 55 illustrate steps of manufacturing an SOI substrate by an ELTRAN technique.

First, a silicon substrate 21 is prepared and a porous silicon layer TS is formed on its main surface, as shown in FIG. 49. The porous silicon layer TS is formed by converting the surface of the silicon substrate 21 to a porous state through anodization process of dipping the silicon substrate (single-crystalline silicon substrate) 21 and an electrode such as a platinum electrode, for example, in hydrofluoric acid (HF) and feeding a current between the silicon substrate 21 serving as an anode and the platinum electrode serving as a cathode.

Figure 50:
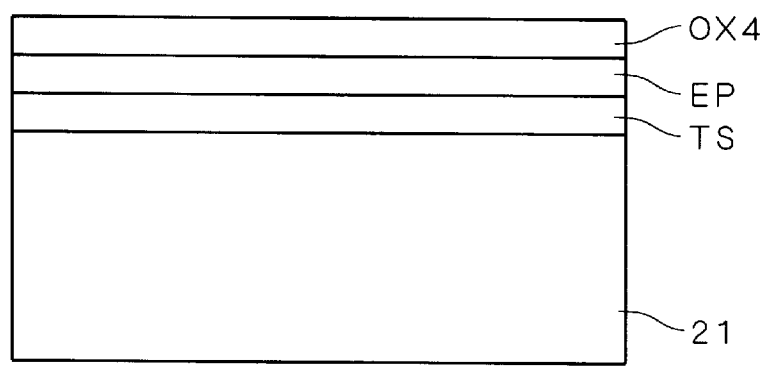

Then, a single-crystalline silicon layer is epitaxially grown on the porous silicon layer TS for forming an epitaxial layer EP, as shown in FIG. 50. A thermal oxide film OX4 is formed on the epitaxial layer EP.

Figure 51:
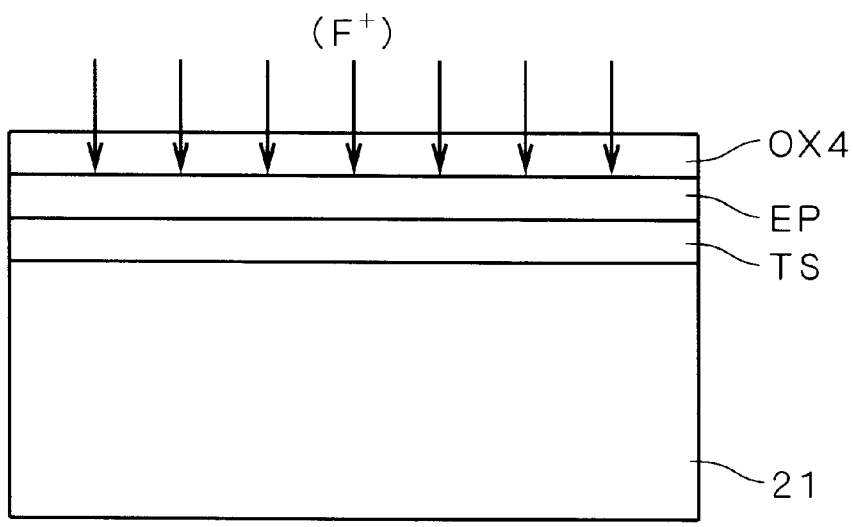

In the step shown in FIG. 51, fluorine is ion-implanted into the thermal oxide film OX4 to reach a dose of $1\times10^{14}$ to $1\times10^{19}$ cm$^{-2}$. Injection energy is so set that the range (Rp) of fluorine ions is about half the thickness of the thermal oxide film OX4, in order to uniformly diffuse injected fluorine in the thermal oxide film OX4 in a high-temperature annealing step described later. When the thickness of the thermal oxide film OX4 is 400 nm (4000 Å), for example, injection energy is set to 120 to 130 keV, in order to implant fluorine ions into a central portion of the thermal oxide film OX4.

Fluorine may be injected in two stages by performing ion implantation into a position closer to the upper portion of the thermal oxide film OX4 as a first stage and then performing ion implantation into a position closer to the lower portion of the thermal oxide film OX4 as a second stage. When the thickness of the thermal oxide film OX4 is 400 nm, for example, injection energy for the first stage may be set to 60 keV and that for the second stage may be set to 180 keV.

Figure 52:
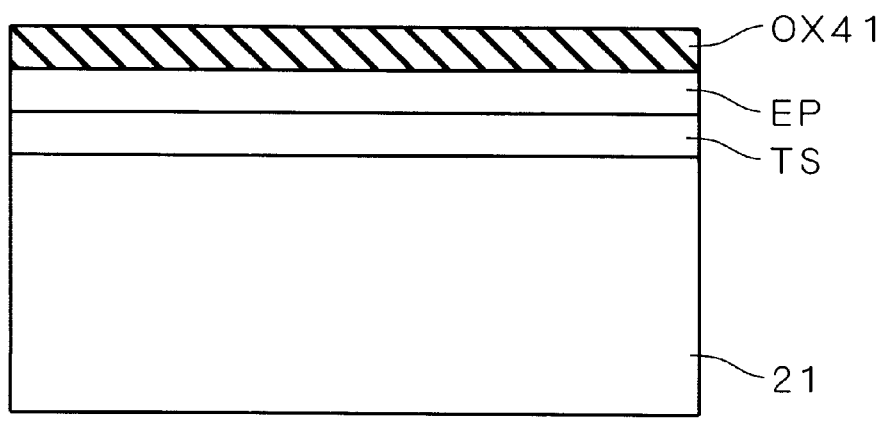

In the step shown in FIG. 52, heat treatment (high-temperature annealing) is performed under a temperature condition of 1000 to 1300° C. for uniformly diffusing fluorine in the thermal oxide film OX4, thereby forming an oxide film OX41 containing uniformly diffused fluorine.

Figure 53:
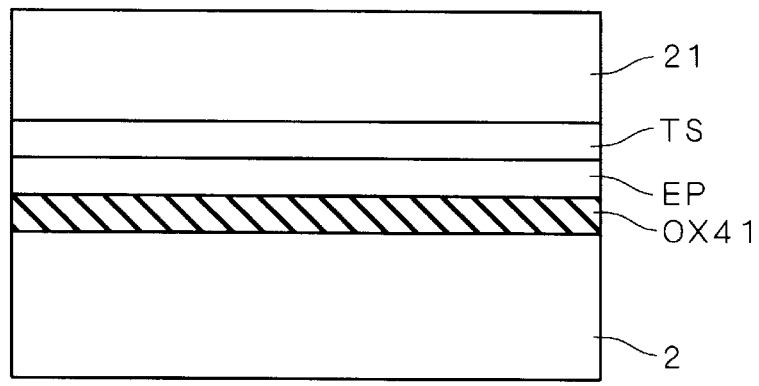

In the step shown in FIG. 53, the silicon substrate 21 is bonded with a separately prepared silicon substrate 2, so that the main surface of the silicon substrate 21 formed with the oxide film OX41 is opposed to the main surface of the silicon substrate 2.

Figure 54:
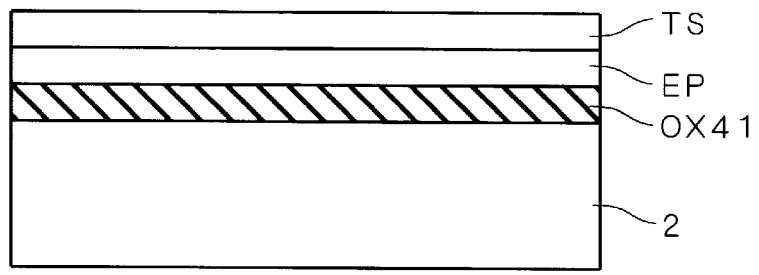

In the step shown in FIG. 54, an unnecessary portion (portion opposite to the oxide film OX41) of the silicon substrate 21 is polished/removed through the porous silicon layer TS, thereby exposing the surface of the porous silicon layer TS. The unnecessary portion may alternatively be exfoliated through the porous silicon layer TS by applying physical force to the porous silicon layer TS.

Figure 55:
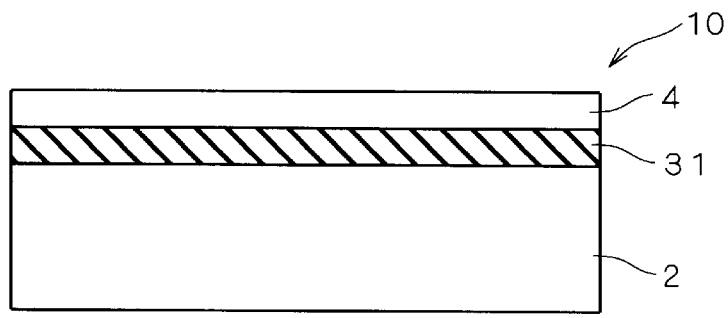

Then, the porous silicon layer TS is removed by etching for exposing the epitaxial layer EP and thereafter hydrogen annealing is performed under a temperature condition of 1100 to 1300° C. for reforming the exposed surface of the epitaxial layer EP so that the epitaxial layer EP defines an SOI layer 4 and the oxide film OX41 uniformly containing fluorine defines the so-called buried oxide film 31, thereby completing the SOI substrate 10 as shown in FIG. 55. The high-temperature annealing described with reference to FIG. 52 may be replaced with the aforementioned hydrogen annealing.

While the above description has been made with reference to the method of forming the oxide film OX41 containing uniformly distributed fluorine by forming the thermal oxide film OX4, thereafter implanting fluorine ions into the thermal oxide film OX4 and uniformly diffusing fluorine in the thermal oxide film OX4 by high-temperature annealing, an oxide film 41 containing fluorine may be formed on the epitaxial layer EP by CVD employing reactive gas containing fluorine, in place of the steps shown in FIGS. 50 to 52. The oxide film OX41 containing fluorine may be formed under a temperature condition of 300 to 450° C. by plasma CVD, for example, while selecting any one of $NF_3$ gas, $CF_4$ gas and $C_2F_6$ gas as the reactive gas containing fluorine in addition to TEOS gas and oxygen gas.

<C-5. Modification>

While the above description has been made with reference to the method of manufacturing a buried oxide film uniformly containing fluorine by ion-implanting fluorine when manufacturing an SOI substrate through the high-dose SIMOX, the smart cut technique or the ELTRAN technique, the buried oxide film uniformly containing fluorine may alternatively be formed by preparing an SOI substrate having a conventional buried oxide film formed by an oxide film and ion-implanting fluorine into the buried oxide film to reach a dose of $1\times10^{14}$ to $1\times10^{19}$ cm$^{-2}$ through the high-dose SIMOX, the smart cut technique or the ELTRAN technique.

When the thickness of the buried oxide film is 4000 Å (400 nm) and the thickness of a silicon layer (i.e., the SOI layer) on the buried oxide film is 1700 Å (170 nm), for example, a buried oxide film containing uniformly diffused fluorine can be formed by setting injection energy for fluorine to about 220 keV, ion-implanting fluorine into a central portion of the buried oxide film and performing heat treatment (high-temperature annealing) under a temperature condition of 1000 to 1300° C.

In this case, fluorine may be injected in two stages by performing ion implantation into a position closer to the upper portion of the buried oxide film as a first stage and performing ion implantation into a position closer to the lower portion of the buried oxide film as a second stage, as a matter of course.

When forming an SOI substrate including a buried oxide film having a thickness of 4000 Å and a silicon layer (i.e., an SOI layer), provided on the buried oxide film, having a thickness of 1700 Å, for example, fluorine is injected with energy of 160 keV as a first stage, and then injected with energy of 260 keV as a second stage.

<D. Fourth Embodiment>

While the third embodiment has been described with reference to the method of manufacturing an SOI substrate having a buried oxide film containing uniformly distributed fluorine in advance of manufacturing a semiconductor device, a method of forming a buried oxide film containing uniformly distributed fluorine in steps of manufacturing a semiconductor device is described with reference to a fourth embodiment of the present invention.

Figure 56:
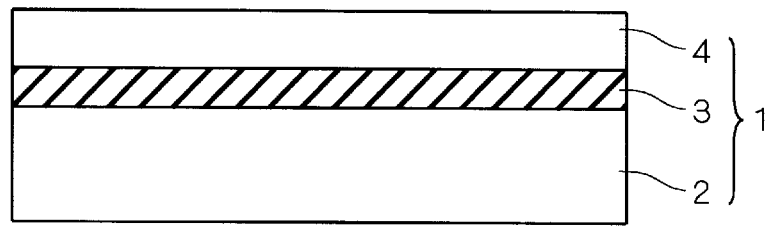
FIGS. 56 to 64 illustrate steps of manufacturing a MOS transistor according to a fourth embodiment of the present invention.

First, an SOI substrate 1 having a conventional buried oxide film 3 formed by an oxide film is prepared through the high-dose SIMOX, the smart cut technique, the ELTRAN technique or the like, as shown in FIG. 56.

Figure 57:
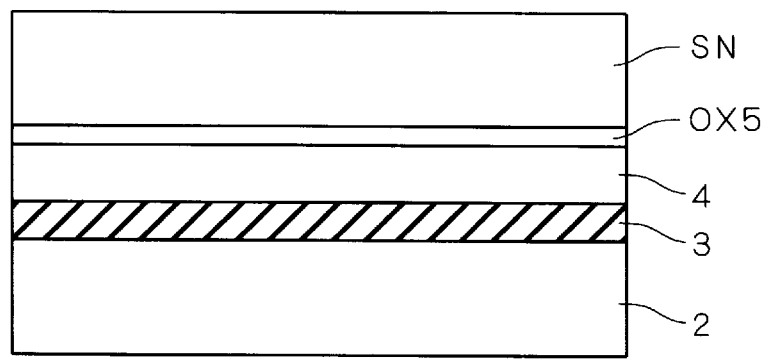

In a step shown in FIG. 57, a thermal oxide film OX5 is formed on the main surface of an SOI layer 4 under a temperature condition of 700 to 1000° C., and then a nitride ($Si_3N_4$) film SN of 1000 to 3000 Å in thickness is formed on the thermal oxide film OX5 by LPCVD (low-pressure CVD) under a temperature condition of 700 to 850° C. A polysilicon layer of 100 to 1000 Å in thickness may be formed between the thermal oxide film OX5 and the nitride film SN.

Figure 58:
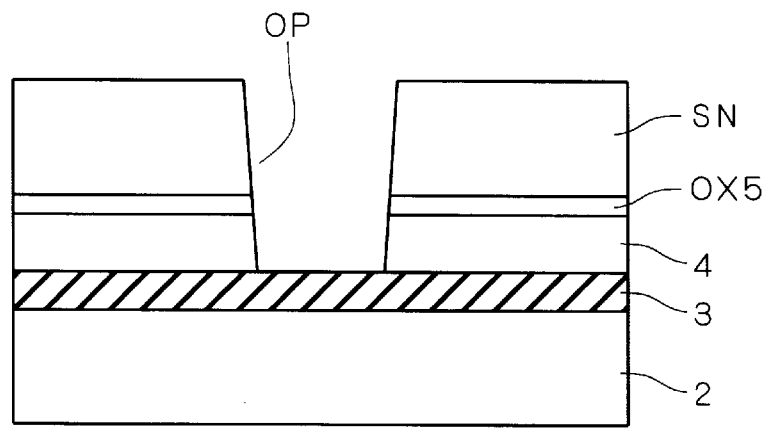

Then, a resist pattern (not shown) is formed on the nitride film SN by photolithography, and then the nitride film SN is patterned by etching on the basis of the resist pattern. The resist pattern is removed, and thereafter the thermal oxide film OX5 and the SOI layer 4 are removed by etching through the patterned nitride film SN serving as a mask, thereby forming an opening OP reaching the surface of the buried oxide film 3 as shown in FIG. 58.

Figure 59:
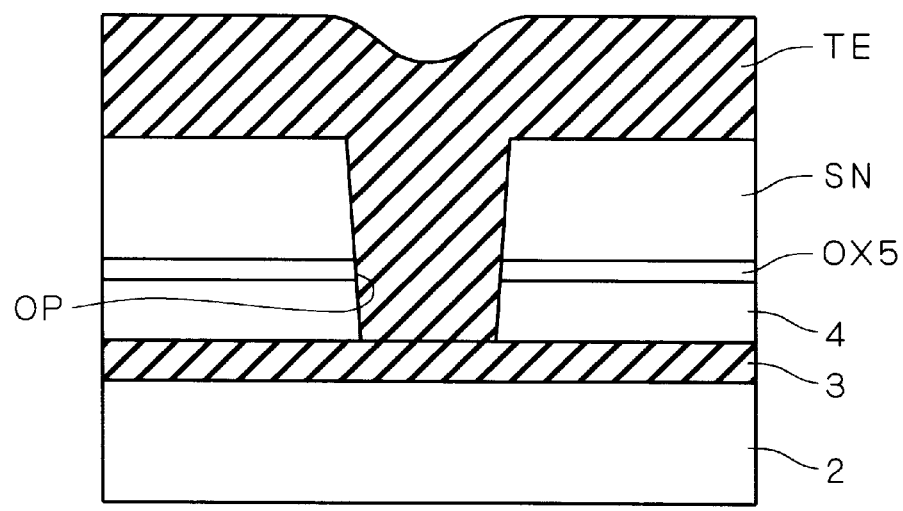

In a step shown in FIG. 59, a TEOS film TE of 1 to 2 $\mu$m in thickness is formed over the entire surface of the substrate 2, to fill up the opening OP with the TEOS film TE. Thereafter heat treatment (annealing) is performed under a temperature condition of 900 to 1200° C.

Figure 60:
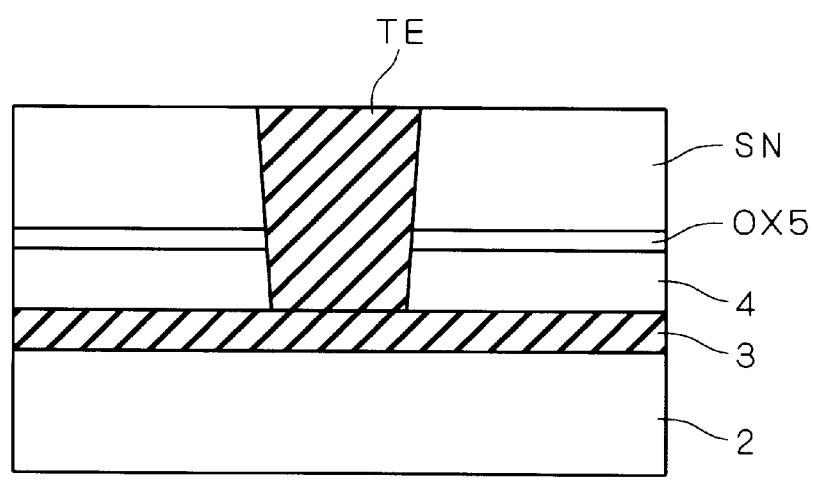

In a step shown in FIG. 60, the TEOS film TE is removed by chemical mechanical polishing (CMP) for exposing the surface of the nitride film SN and performing flattening.

Figure 61:
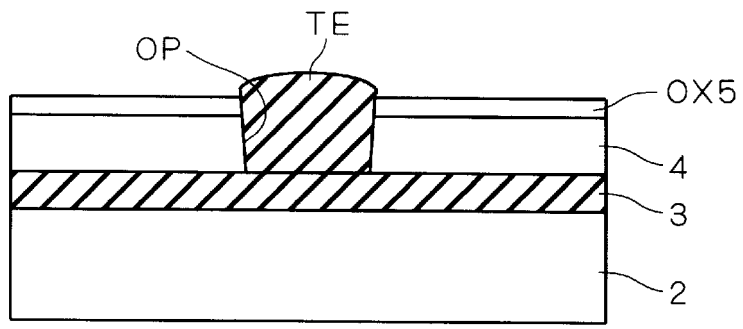

In a step shown in FIG. 61, the nitride film SN is removed by etching, for exposing the thermal oxide film OX5. At this time, the TEOS film TE filling up the opening OP is partially exposed.

Figure 62:
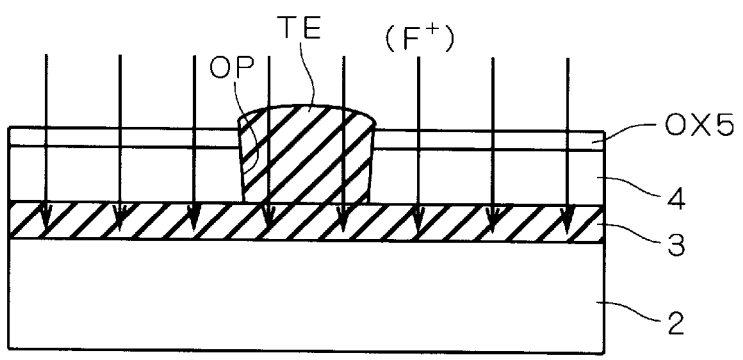
Figure 63:
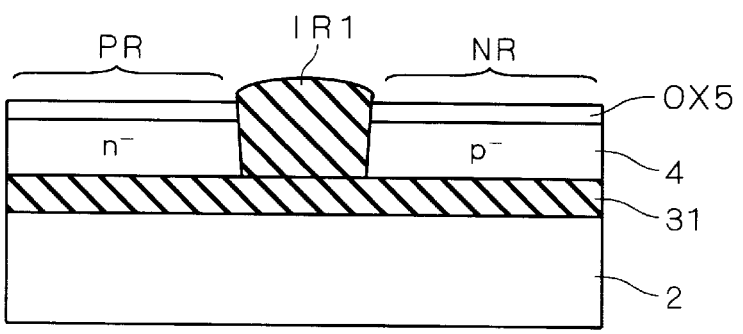
Figure 64:
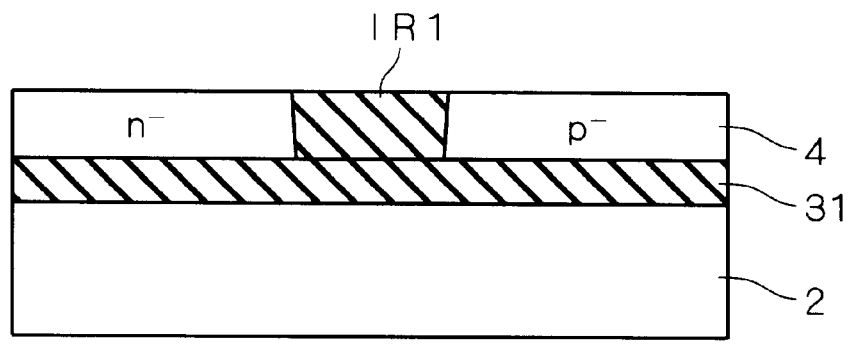

In a step shown in FIG. 62, fluorine is ion-implanted into the buried oxide film 3 to reach a dose of $1\times10^{14}$ to $1\times10^{19}$ cm$^{-2}$. When the buried oxide film 3 is 4000 Å (400 nm) in thickness and a silicon layer (i.e., the SOI layer 4) on the buried oxide film 3 is 1000 Å (100 nm) in thickness, for example, injection energy for fluorine is set to about 100 to 240 keV. Thereafter heat treatment (annealing) is performed under a temperature condition of 1000 to 1300° C., so that fluorine in the buried oxide film 3 is diffused and a buried oxide film 31 containing uniformly diffused fluorine can be formed as shown in FIG. 63. At this time, fluorine is diffused also in the TEOS film TE filling up the opening OP, so that the TEOS film TE defines an element isolation film IR1 containing fluorine and having a reduced relative dielectric constant. The maximum fluorine concentration in the element isolation film IR1 is preferably at any level in the range of $1\times10^{19}$ to $1\times10^{22}$ cm$^{-3}$, and if the fluorine concentration in the TEOS film TE cannot be sufficiently obtained by diffusion through the aforementioned step, fluorine may be previously introduced into the TEOS film TE in the step shown in FIG. 59.

The step shown in FIG. 63 includes steps of channel-injecting p-type and n-type impurities into an n-type MOS transistor forming region (referred to as an nMOS region) NR and a p-type MOS transistor forming region (referred to as a pMOS region) PR in the SOI layer 4 isolated by the element isolation film IR1.

Figure 65:
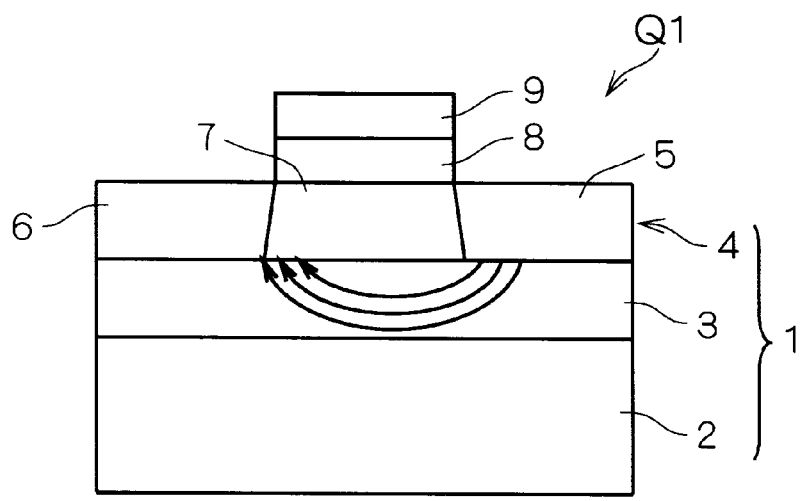
FIG. 65 illustrates a sectional structure of a conventional MOS transistor formed on an SOI substrate.
Figure 66A:
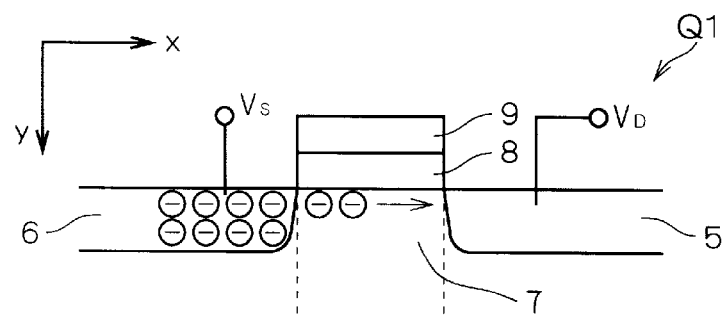
FIG. 66A and FIG. 66B illustrate a problem of the conventional MOS transistor formed on an SOI substrate.
Figure 66B:
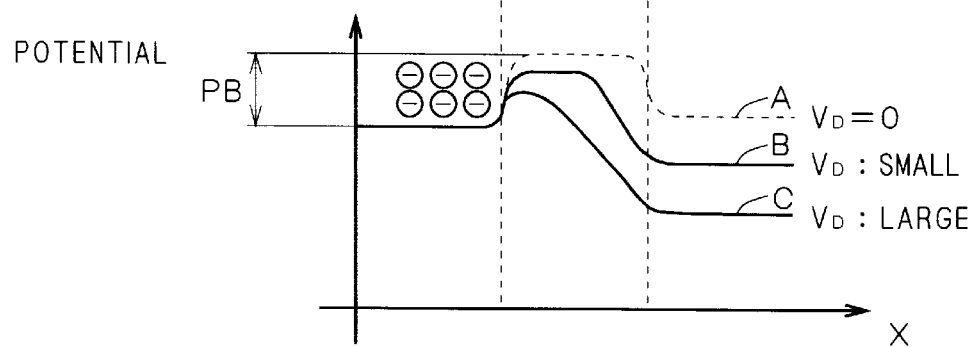
Figure 67:
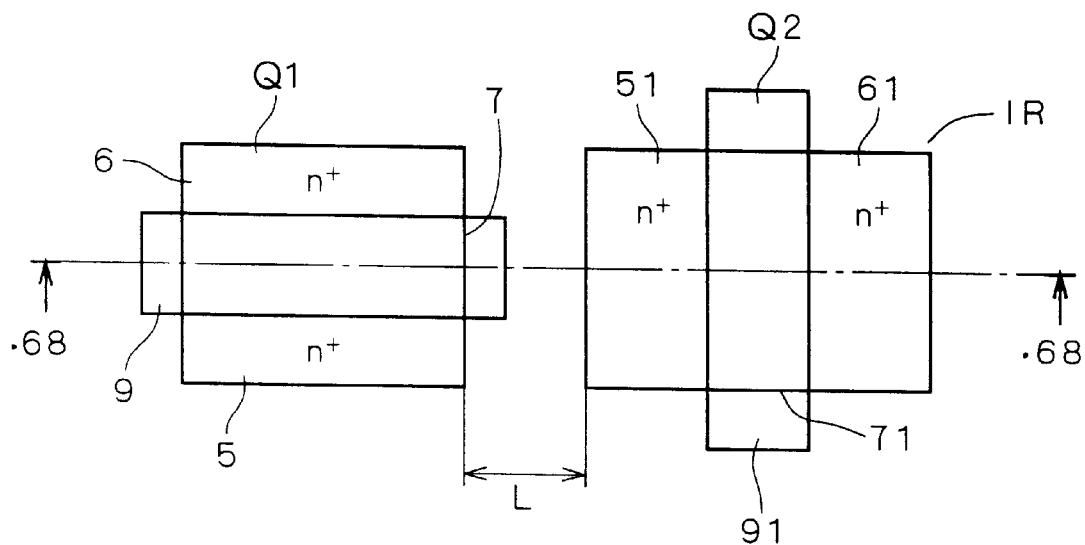
FIG. 67 illustrates a plane structure of conventional MOS transistors formed on an SOI substrate.
Figure 68:
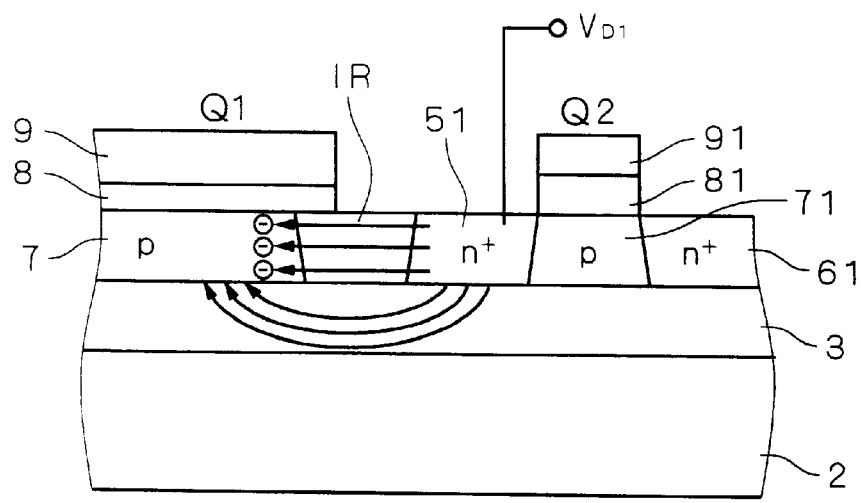
FIG. 68 illustrates a problem of the conventional MOS transistors formed on an SOI substrate.

Finally, the thermal oxide film OX5 is removed in a step shown in FIG. 65 while a projecting part of the element isolation film IR1 is removed, to obtain a structure having the nMOS region NR and the pMOS region PR electrically isolated by the element isolation film IR1 and the buried oxide film 31.

Thereafter a desired semiconductor device can be obtained by forming MOS transistors in the nMOS region NR and the pMOS region PR by a conventional method.

In the aforementioned method, fluorine ion implantation and high-temperature annealing are performed before channel injection deciding thresholds of MOS transistors, whereby concentration distribution of channel-injected impurities is not influenced by high-temperature annealing.

While each of the first to fourth embodiments of the present invention has been described mainly with reference to the case of applying the present invention to an n-channel transistor, the present invention is also applicable to a p-channel transistor to attain a function/effect similar to that in the case of applying the present invention to an n-channel transistor, as a matter of course. The present invention is further applicable not only to an n-channel transistor and a p-channel transistor manufactured independently of each other but also to an n-channel transistor and a p-channel transistor prepared in steps of manufacturing a CMOS (complementary MOS) device.

Each of the first to fourth embodiments has been described mainly with reference to suppression of influence by the DIBL effect in the MOSFET and reduction of edge leakage. When a semiconductor element other than a MOSFET is formed on an SOI substrate having a buried oxide film uniformly containing fluorine, however, parasitic capacitances between the element and a silicon substrate can be reduced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an SOI substrate having a silicon substrate, a buried oxide film containing fluorine formed on said silicon substrate and an SOI layer formed on said buried oxide film; and
   a semiconductor element formed on said SOI layer, wherein
   said buried oxide film substantially uniformly contains fluorine in prescribed concentration over the whole area.

2. The semiconductor device according to claim 1, wherein
   said semiconductor element is a MOSFET.

3. The semiconductor device according to claim 2, wherein
   the maximum value of said prescribed concentration of fluorine is any level in the range of $1\times10^{19}$ to $1\times10^{22}$ cm$^{-3}$.

4. The semiconductor device according to claim 2, further comprising an element isolation film formed in said SOI layer around said MOSFET to reach the main surface of said buried oxide film from the main surface of said SOI layer, wherein
   said element isolation film contains fluorine.

5. The semiconductor device according to claim 1, wherein
   said semiconductor element is a MOSFET,
   said MOSFET has a channel region forming a channel and a drain region and a source region formed on both sides of said channel region in said SOI layer, and
   said buried oxide film includes:
   first and second fluorine-containing regions formed in regions corresponding to lower portions of said drain region and said source region and substantially uniformly containing fluorine in prescribed concentration over the whole areas, and
   a normal region formed in a region corresponding to a lower portion of said channel region and containing no fluorine.

6. The semiconductor device according to claim 5, wherein
   the maximum value of said prescribed concentration of fluorine is any level in the range of $1\times10^{19}$ to $1\times10^{22}$ cm$^{-3}$.

7. The semiconductor device according to claim 5, further comprising an element isolation film formed in said SOI layer around said MOSFET to reach the main surface of said buried oxide film from the main surface of said SOI layer, wherein said element isolation film contains fluorine.

8. A semiconductor device comprising:
   a silicon substrate;
   a MOSFET formed on said silicon substrate; and
   an element isolation film formed in the main surface of said silicon substrate around said MOSFET, wherein
   said element isolation film contains fluorine.

9. A semiconductor device comprising:
   an SOI substrate having a silicon substrate, a buried oxide film formed on said silicon substrate and an SOI layer formed on said buried oxide film;
   a MOSFET formed on said SOI layer; and
   an element isolation film formed in said SOI layer around said MOSFET to reach the main surface of said buried oxide film from the main surface of said SOI layer, wherein
   said element isolation film contains fluorine.

10. A semiconductor device comprising:
    an SOI substrate having a silicon substrate, a buried oxide film containing fluorine formed on said silicon substrate and an SOI layer formed on said buried oxide film; and
    a semiconductor element formed on said SOI layer, wherein
    said buried oxide film contains fluorine over the whole area in a depth direction.

11. The semiconductor device according to claim 10, wherein
    said semiconductor element is a MOSFET.

12. The semiconductor device according to claim 11 wherein
    the maximum value of said prescribed concentration of fluorine is any level in the range of $1\times10^{19}$ to $1\times10^{22}$ cm$^{-3}$.

13. The semiconductor device according to claim 11, further comprising an element isolation film formed in said SOI layer around said MOSFET to reach the main surface of said buried oxide film from the main surface of said SOI layer, wherein
    said element isolation film contains fluorine.

14. The semiconductor device according to claim 10, wherein
    said semiconductor element is a MOSFET,
    said MOSFET has a channel region forming a channel and a drain region and a source region formed on both sides of said channel region in said SOI layer, and
    said buried oxide film includes:
    first and second fluorine-containing regions formed in regions corresponding to lower portions of said drain region and said source region and substantially uniformly containing fluorine in prescribed concentration over the whole areas, and
    a normal region formed in a region corresponding to a lower portion of said channel region and containing no fluorine.

15. The semiconductor device according to claim 14, wherein
    the maximum value of said prescribed concentration of fluorine is any level in the range of $1\times10^{19}$ to $1\times10^{22}$ cm$^{-3}$.

16. The semiconductor device according to claim 14, further comprising an element isolation film formed in said SOI layer around said MOSFET to reach the main surface of said buried oxide film from the main surface of said SOI layer, wherein said element isolation film contains fluorine.

17. A semiconductor device comprising:

an SOI substrate having a silicon substrate, a buried oxide film formed on said silicon substrate and an SOI layer formed on said buried oxide film;

a MOSFET formed on said SOI layer, and an element isolation film formed in said SO layer around said MOSFET, wherein said element isolation film contains fluorine.

* * * * *